(12) United States Patent
Hu et al.

(10) Patent No.: US 12,382,820 B2
(45) Date of Patent: Aug. 5, 2025

(54) DISPLAY PANEL

(71) Applicants: Chengdu BOE Optoelectronics Technology Co., Ltd., Sichuan (CN); BOE Technology Group Co., Ltd., Beijing (CN)

(72) Inventors: Wenbo Hu, Beijing (CN); Rui Cheng, Beijing (CN); Qiang Fu, Beijing (CN); Yaohong Tan, Beijing (CN); Wen Sun, Beijing (CN); Jenyu Lee, Beijing (CN); Xuwei Li, Beijing (CN); Jianyun Xu, Beijing (CN); Gaoqiang Wang, Beijing (CN); Jinyu Chao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/022,435

(22) PCT Filed: Jun. 1, 2022

(86) PCT No.: PCT/CN2022/096679
§ 371 (c)(1),
(2) Date: Feb. 21, 2023

(87) PCT Pub. No.: WO2023/040360
PCT Pub. Date: Mar. 23, 2023

(65) Prior Publication Data
US 2024/0268189 A1    Aug. 8, 2024

(30) Foreign Application Priority Data
Sep. 16, 2021 (CN) .......................... 202111086347.9

(51) Int. Cl.
*H10K 59/88* (2023.01)
*G06F 3/044* (2006.01)
(Continued)

(52) U.S. Cl.
CPC .......... *H10K 59/88* (2023.02); *G06F 3/0446* (2019.05); *H10K 59/40* (2023.02); *H10K 59/65* (2023.02);
(Continued)

(58) Field of Classification Search
None
See application file for complete search history.

(56) References Cited

U.S. PATENT DOCUMENTS 10,347,866 B1    7/2019  Kim
10,541,380 B1 *  1/2020  Sung .................... H10K 59/122
(Continued)

FOREIGN PATENT DOCUMENTS

CN    109032414 A    12/2018
CN    110277510 A    9/2019
(Continued)

OTHER PUBLICATIONS

Extended (Supplementary) European Search Report dated Oct. 10, 2023, issued in counterpart EP Application No. 20963903.8. (9 pages).

(Continued)

*Primary Examiner* — Stephen T. Reed
(74) *Attorney, Agent, or Firm* — WHDA, LLP

(57) ABSTRACT

A display panel, which belongs to the technical field of display devices. The display panel includes an opening area (20) provided with an opening: an active area (70) at least partially surrounding the opening area (20); and a first anti-crack area (40). The display panel in the first anti-crack area (40) further includes: at least one circle of anti-crack (Continued)

protective layer (41); the active area (70) includes at least one touch electrode layer (71); and the anti-crack protective layer (41) and at least one of the at least one touch electrode layer (71) are arranged in a same layer and with a same material. The anti-crack protective layer (41) of the display panel of the present disclosure may improve the anti-crack ability of the area surrounding the digging holes.

17 Claims, 26 Drawing Sheets

(51) Int. Cl.
*H10K 59/40* (2023.01)
*H10K 59/65* (2023.01)
*H10K 59/80* (2023.01)

(52) U.S. Cl.
CPC ....... *H10K 59/8721* (2023.02); *H10K 59/873* (2023.02); *G06F 2203/04111* (2013.01)

(56) References Cited

U.S. PATENT DOCUMENTS

| | | | |
|---|---|---|---|
| 2020/0083475 A1* | 3/2020 | Kang | H10K 50/84 |
| 2020/0152707 A1 | 5/2020 | Won et al. | |
| 2020/0168683 A1 | 5/2020 | Son et al. | |
| 2020/0176520 A1 | 6/2020 | Kim et al. | |
| 2020/0259121 A1 | 8/2020 | Lee et al. | |
| 2021/0057658 A1 | 2/2021 | Chen | |
| 2021/0096697 A1 | 4/2021 | Do et al. | |
| 2021/0193960 A1 | 6/2021 | Song et al. | |
| 2021/0210718 A1 | 7/2021 | Zhang et al. | |
| 2021/0408064 A1 | 12/2021 | Zhang et al. | |
| 2021/0408150 A1 | 12/2021 | Zhang et al. | |
| 2022/0029132 A1 | 1/2022 | Lee et al. | |
| 2022/0223628 A1 | 7/2022 | Li | |
| 2023/0092157 A1 | 3/2023 | Lee et al. | |
| 2023/0145922 A1 | 5/2023 | Huang et al. | |

FOREIGN PATENT DOCUMENTS

| | | | |
|---|---|---|---|
| CN | 110335891 | A | 10/2019 |
| CN | 110444683 | A | 11/2019 |
| CN | 110620187 | A | 12/2019 |
| CN | 110634887 | A | 12/2019 |
| CN | 110970576 | A | 4/2020 |
| CN | 111258444 | A | 6/2020 |
| CN | 111276507 | A | 6/2020 |
| CN | 111740028 | A | 10/2020 |
| CN | 112018045 | A | 12/2020 |
| CN | 113345942 | A | 9/2021 |
| CN | 113889517 | A | 1/2022 |
| IN | 111258456 | A | 6/2020 |
| KR | 20200030713 | A | 3/2020 |
| KR | 20200067576 | A | 6/2020 |
| KR | 20200073549 | A | 6/2020 |
| WO | 2020/192121 | A1 | 10/2020 |
| WO | 2020191623 | A1 | 10/2020 |

OTHER PUBLICATIONS

Office Action dated Aug. 17, 2022, issued in CN application No. 202111086347.9, with English translation. (17 pages).
Office Action dated Mar. 1, 2023, issued in CN application No. 202080003174.7, with English translation. (16 pages).
Office Action dated May 26, 2023, issued in CN application No. 202080003174.7, with English translation. (7 pages).
Office Action dated Jun. 1, 2023, issued in CN application No. 202111086347.9, with English translation. (11 pages).
International Search Report dated Sep. 3, 2021, issued in counterpart International application No. PCT/CN2020/133432, with English translation. (15 pages).
Notice of Reasons for Refusal dated Oct. 1, 2024, issued in JP Application No. 2023-524649, with English translation. (18 pages).
Extended (Supplementary) European Search Report dated Jul. 5, 2024, issued in counterpart EP Application No. 22868737.2. (11 pages).
Office Action dated May 30, 2025, issued in counterpart KR Application No. 10-2023-7013659, with English translation. (16 pages).

* cited by examiner

DISPLAY PANEL

CROSS-REFERENCE TO RELATED APPLICATIONS

The present disclosure claims priority to the Chinese patent application No. 202111086347.9, entitled "DISPLAY PANEL AND PREPARATION METHOD THEREOF, AND DISPLAY DEVICE" filed in China National Intellectual Property Administration on Sep. 16, 2021, which is incorporated herein by reference in their entirety.

TECHNICAL FIELD

The present disclosure relates to the technical field of display devices, in particular to a display panel.

BACKGROUND

Narrow borders and thin display screens are required due to the portability feature of mobile display terminals and the visual experience of users. After the full screen appears, in order to improve the screen-to-body ratio of the screen, various designs of special-shaped screens have competed to appear, from bang screen to water drop screen, and then to the current mainstream digging screen. Using screens with smaller aperture may improve the user experience and bring better immersion. In related art, a solution that is to punch holes inside the active area of the display panel and place cameras, sensors. etc. in the holes has been proposed, so as to improve the screen-to-body ratio and enhance the visual impact when the users view the display screen.

SUMMARY

According to the first aspect of the present disclosure, a display panel is provided, including:
 an opening area, wherein the opening area is provided with an opening;
 an active area, wherein the active area at least partially surrounds the opening area; and
 a first anti-crack area, wherein the first anti-crack area at least partially surrounds the opening area;
 wherein the display panel in the first anti-crack area further includes: a substrate, an encapsulation layer located on the substrate, and at least one circle of anti-crack protective layer located on the encapsulation layer;
 the active area includes at least one touch electrode layer; and
 the anti-crack protective layer and at least one of the at least one touch electrode layer are arranged in a same layer and with a same material.

Optionally, the anti-crack protective layer includes at least one layer of metal, and the touch electrode layer includes a touch metal layer.

Optionally, the substrate and the encapsulation layer extend to the active area; and the touch metal layer is located on a side of the encapsulation layer away from the substrate.

Optionally, the at least one touch electrode layer includes a first touch metal layer closer to the substrate, a second touch metal layer and a touch medium layer between the first touch metal layer and the second touch metal layer, and the anti-crack protective layer and the first touch metal layer are arranged in a same layer and with a same material; and/or the anti-crack protective layer and the second touch metal layer are arranged in a same layer and with a same material.

Optionally, the first touch metal layer is a bridging layer, the second touch metal layer is an electrode pattern layer, and the bridging layer is electrically connected to at least part of the electrode pattern layer through a through-hole penetrating the touch medium layer.

Optionally, the anti-crack protective layer includes a first anti-crack protective layer and a second anti-crack protective layer that are stacked, and the first anti-crack protective layer is provided between the second anti-crack protective layer and the substrate;
 wherein the first anti-crack protective layer and the first touch metal layer are arranged in a same layer and with a same material; and
 the second anti-crack protective layer and the second touch metal layer are arranged in a same layer and with a same material.

Optionally, the anti-crack protective layer includes a single-layer or tandem structure of metal or metal oxide.

Optionally, the metal includes at least one of: copper, molybdenum, titanium-aluminum-titanium; and
 the metal oxide includes: indium tin oxide.

Optionally, the first anti-crack area further includes at least one circle of first anti-crack dam located under the encapsulation layer, and the first anti-crack dam and the anti-crack protective layer are distributed on two sides of the encapsulation layer.

Optionally, the first anti-crack dam and the anti-crack protective layer are stacked on two sides of the encapsulation layer, and an orthographic projection of the anti-crack protective layer on the substrate at least partially covers an orthographic projection of the first anti-crack dam on the substrate.

Optionally, the first anti-crack dam and the anti-crack protective layer are dislocated on two sides of the encapsulation layer, and an orthographic projection of the anti-crack protective layer on the substrate is located between orthographic projections of two adjacent first anti-crack dams on the substrate.

Optionally, the display panel further includes: a stop zone surrounding the first anti-crack area; and
 the substrate and the encapsulation layer extend to the stop zone, and a stop dam is provided between the encapsulation layer and the substrate that are located in the stop zone.

Optionally, the display panel further includes: a second anti-crack area surrounding the stop zone; the display panel in the second anti-crack area further includes: the substrate, and the encapsulation layer located on the substrate; wherein a second anti-crack dam is provided between the encapsulation layer and the substrate located in the second anti-crack area.

Optionally, the anti-crack protective layer and an orthographic projection of the first anti-crack dam and/or the second anti-crack dam have at least partially overlapped area.

Optionally, an area of the encapsulation layer contacted with at least one circle of first anti-crack dam and/or at least one circle of second anti-crack dam includes at least one concave structure, and the anti-crack protective layer at least covers the concave structure.

Optionally, the opening is provided with at least one on the display panel; and
 the shape of the opening includes one of: circle, strip, and runway-shaped.

According to the second aspect of the present disclosure, a display panel is provided, including:

an opening area, wherein the opening area is provided with an opening;

an active area, wherein the active area at least partially surrounds the opening area; and a first anti-crack area, wherein the first anti-crack area at least partially surrounds the opening area;

wherein the display panel in the first anti-crack area further includes: a substrate, a encapsulation layer located on the substrate, at least one circle of anti-crack protective layer located on the encapsulation layer and at least one circle of first anti-crack dam located under the encapsulation layer; an area of the encapsulation layer contacted with at least one circle of first anti-crack dam includes at least one concave structure, the anti-crack protective layer at least covers the concave structure.

Optionally, the first anti-crack dam and the anti-crack protective layer are stacked on two sides of the encapsulation layer, and an orthographic projection of the anti-crack protective layer on the substrate at least partially covers an orthographic projection of the first anti-crack dam on the substrate.

Optionally, the first anti-crack dam and the anti-crack protective layer are dislocated on two sides of the encapsulation layer, and an orthographic projection of the anti-crack protective layer on the substrate is located between orthographic projections of two adjacent first anti-crack dams on the substrate.

Optionally, the first anti-crack dam includes at least one concave-convex structure, so that the encapsulation layer includes a concave structure, and the concave structure includes at least one step perpendicular to a direction of the substrate, and the anti-crack protective layer at least partially covers the step.

Optionally, the concave structure includes at least two first surfaces and a second surface located between the two first surfaces, and two steps connecting the first surfaces and the second surface are perpendicular to the direction of the substrate, and the anti-crack protective layer completely covers the concave structure.

Optionally, the anti-crack protective layer includes a first anti-crack protective layer and a second anti-crack protective layer that are stacked, the first anti-crack protective layer is provided between the second anti-crack protective layer and the substrate; and the first anti-crack protective layer at least partially covers the concave structure, and/or, the second anti-crack protective layer at least partially covers the concave structure.

Optionally, the active area includes at least one touch electrode layer;

wherein the anti-crack protective layer and at least one of the at least one touch electrode layer are arranged in a same layer and with a same material.

Optionally, the at least one touch electrode layer includes a first touch metal layer closer to the substrate, a second touch metal layer and a touch medium layer between the first touch metal layer and the second touch metal layer, the anti-crack protective layer and the first touch metal layer are arranged in a same layer and with a same material; and/or the anti-crack protective layer and the second touch metal layer are arranged in a same layer and with a same material.

The above description is merely a summary of the technical solutions of the present disclosure. In order to more clearly know the technological means of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the drawings that are required to describe the embodiments or the related art will be briefly described below. Apparently, the drawings that are described below are merely embodiments of the present disclosure, and a person skilled in the art may obtain other drawings according to these drawings without paying creative work.

DETAILED DESCRIPTION

In related art, integrating touch functions on a display module is proposed, for example, flexible multi-layer on cell (FMLOC) technology may make a touch signal layer directly on the display layer and encapsulation layer, so as to obtain a thinner screen backplane and a narrower bottom border, and may save manufacturing cost of the display panel, which is the current trend in the development of organic light-emitting diode (OLED) display screens.

For the display panel proposed in the related art of digging the screen in the active area, although the film structure of the excavation area in the active area is optimized, to a certain extent, the cracking of the inorganic encapsulation layer at the edge of the opening in the active area is weakened to spread to the active area, so as to prevent the display layer and touch layer of the display/touch area around the holes of the display panel from cracking, thus guarantying the display effect and touch effect of the display panel.

However, considering the display panel structure proposed in the related art taking metal signal lines associated with the display layer as an anti-cracking device, the anti-cracking effect of the hole digging area is limited, that is, the current display screen realizes digging holes in the active area, and realizes the anti-cracking of the cutting edge to a certain extent. However, the crack resistance of the hole digging area still needs to be improved. Considering the preparation and realization process and structure position of the touch signal layer in the FMLOC technology, the present disclosure proposes a solution to use the relevant structure of the touch layer as an anti-cracking device in the excavation area to improve the crack blocking ability of the edge of the hole digging area of the display panel. Therefore, the present disclosure provides a display panel, a preparation method of the display panel and a display device, by setting a touch anti-crack layer with the same layer as a touch metal layer in the active area and with metal materials in the first anti-crack area around the opening cutting area within the active area of the display panel, the stress of cracks at the opening edge is conducted and dispersed, which may improve the crack resistance in the active area around the digging hole of the display panel with digging holes in the active area without changing the existing overall preparation process.

In order to make the above purposes, features and advantages of the present disclosure more obvious and easier to understand, the present disclosure is further described in detail in conjunction with the drawings and specific embodiments.

Figure 1:
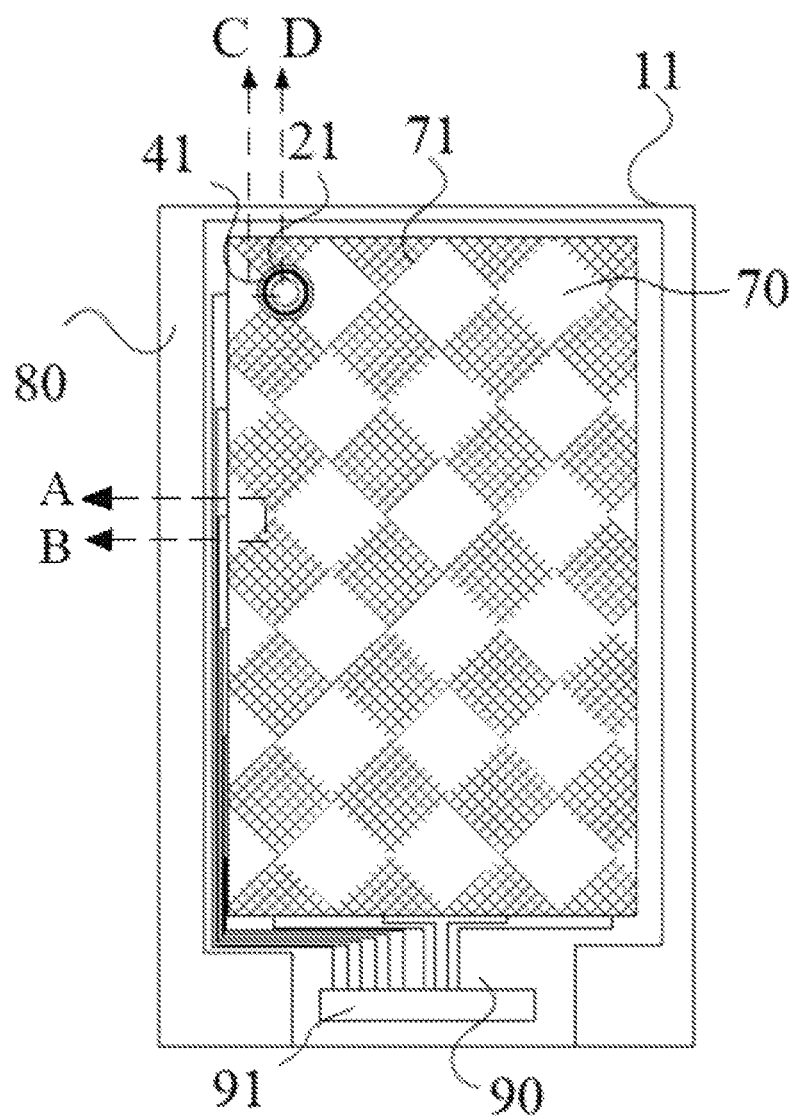
FIG. 1 illustrates an overall schematic diagram of a display panel according to an embodiment of the present disclosure.

Referring to FIG. 1, FIG. 1 is an overall schematic diagram of a display panel provided by an embodiment of the present disclosure. As shown in FIG. 1, the overall structure of the display panel is based on a substrate 11, on which the display panel may be roughly divided into an active area 70, a border area 80, and a signal connection area 90.

Specifically, the substrate 11 may be a flexible substrate or a rigid substrate. When the substrate 11 is the flexible substrate, which may make the display panel have properties such as flexible or bendable. When the substrate 11 is the rigid substrate, which may meet the rigid requirements of the display panel. The performance of the specific substrate 11 is determined according to the actual needs of the product.

Figure 2:
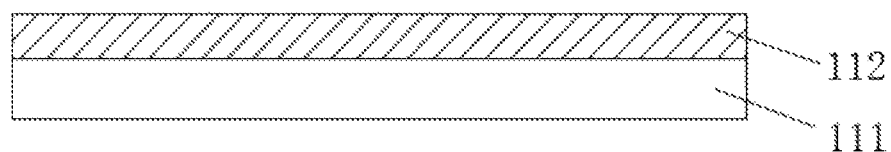
FIG. 2 illustrates a cross-sectional schematic diagram of a substrate of a display panel according to an embodiment of the present disclosure.

In addition, the substrate may include a single-layer structure or a multi-layer structure. For example, as shown in FIG. 2, the substrate may include a polyimide layer and a buffer layer stacked in succession. In some other embodiments, the substrate may also include a plurality of polyimide layers and buffer layers that are stacked in succession. Among them, the buffer layer may be made of silicon nitride or silicon oxide and other materials to achieve the effect of blocking water oxygen and blocking alkaline ions. It should be noted that the structure of the substrate is not limited to this, and it may be determined according to actual needs in specific applications.

An opening area 20 is provided in the active area 70 of the display panel, that is, in the display panel, the active area 70 at least partially surrounds the opening area 20. For example, the opening area 20 may be completely within the range where active area 70 is located, at this time, the opening area 20 is surrounded by the active area 70. And the opening area 20 may also be partially located within the range where the active area 70 is located, at this time, the active area 70 partially surrounds the opening area 20. Among them, in the peripheral area surrounding the opening of the opening area 20, an anti-crack protective layer 41 is provided.

Figure 3:
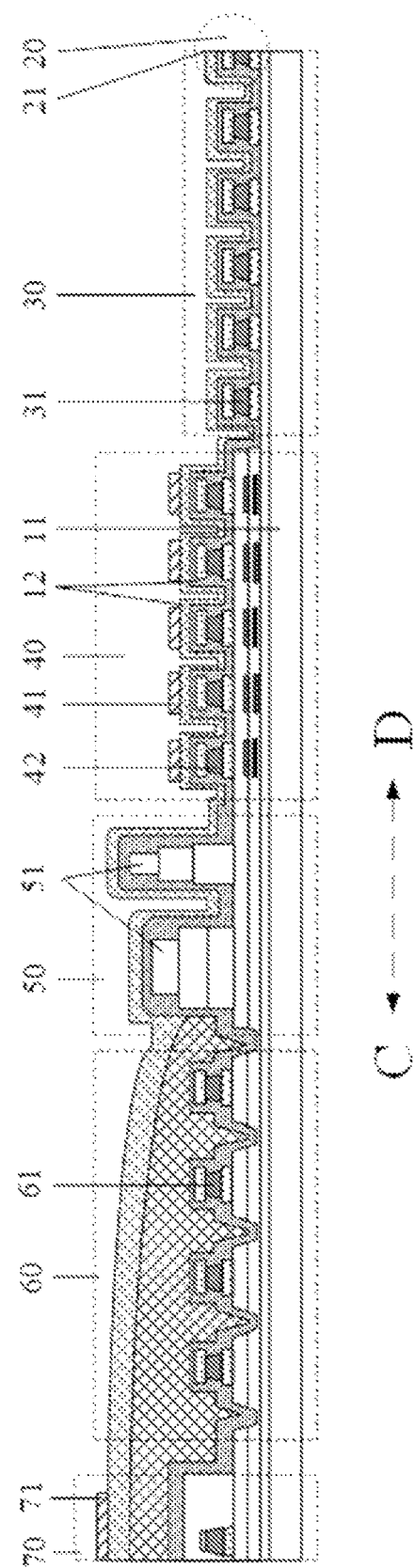
FIG. 3 illustrates a cross-sectional schematic diagram of a display panel in a C-D direction according to an embodiment of the present disclosure.

Referring to FIG. 3, FIG. 3 is a cross-sectional schematic diagram of a display panel provided by the embodiment of the present disclosure. As shown in FIG. 3, the display panel includes: the opening area 20, a cutting remaining area 30, and a first anti-crack area 40.

It should be noted that in order to facilitate the processing of required parts in various areas of the display panel, each area may be defined on the substrate first. For example, the active area 70, the border area 80, the signal connection area 9, the opening area 20, the cutting remaining area 30 and the first anti-crack area 40 on the substrate may be divided first, that is, dividing the active area 70, the border area 80, the signal connection area 9, the opening area 20, the cutting remaining area 30 and the first anti-crack area 40 on the display panel.

Among them, the opening area 20 is provided with an opening 21. Specifically, the opening 21 may be a via hole penetrating an encapsulation layer 12 and the substrate 11, i.e., a through-hole. The opening 21 may also be a concave hole that does not penetrate the display panel.

Specifically, the cutting remaining area 30 is a circle of area around the opening area 20. The cutting remaining area 30 may be a remaining circle area after cutting a circle of cutting area around the opening area 20 in the process of processing a display panel including the opening area 20. The opening area 20, that is, the hole digging area in the active area 70 of the display panel, has a hollow space that may be used to place cameras and various sensors.

Specifically, the first anti-crack area 40 at least partially surrounds the opening area 20. For example, in cases where the opening area 20 is completely located in the range where the active area 70 is located, the first anti-crack area 40 is a circle of area disposed between the active area 70 and the opening area 20. In cases where the opening area 20 is partially located in the range where the active area 70 is located, the first anti-crack area 40 is a section of area incompletely disposed between the opening area 20 and the active area 70.

Referring to FIG. 1, the edge of the opening 21 is a cut edge of digging holes in the active area 70 of the display panel, and is also the edge of the cutting remaining area 30. For example, the opening area 20 may be a circular hole area, then the cutting remaining area 30 may be a circle of ring area around the opening area 20, the first anti-crack area 40 may be a circle of ring area that surrounds the ring of the cutting remaining area 30.

Figure 4:
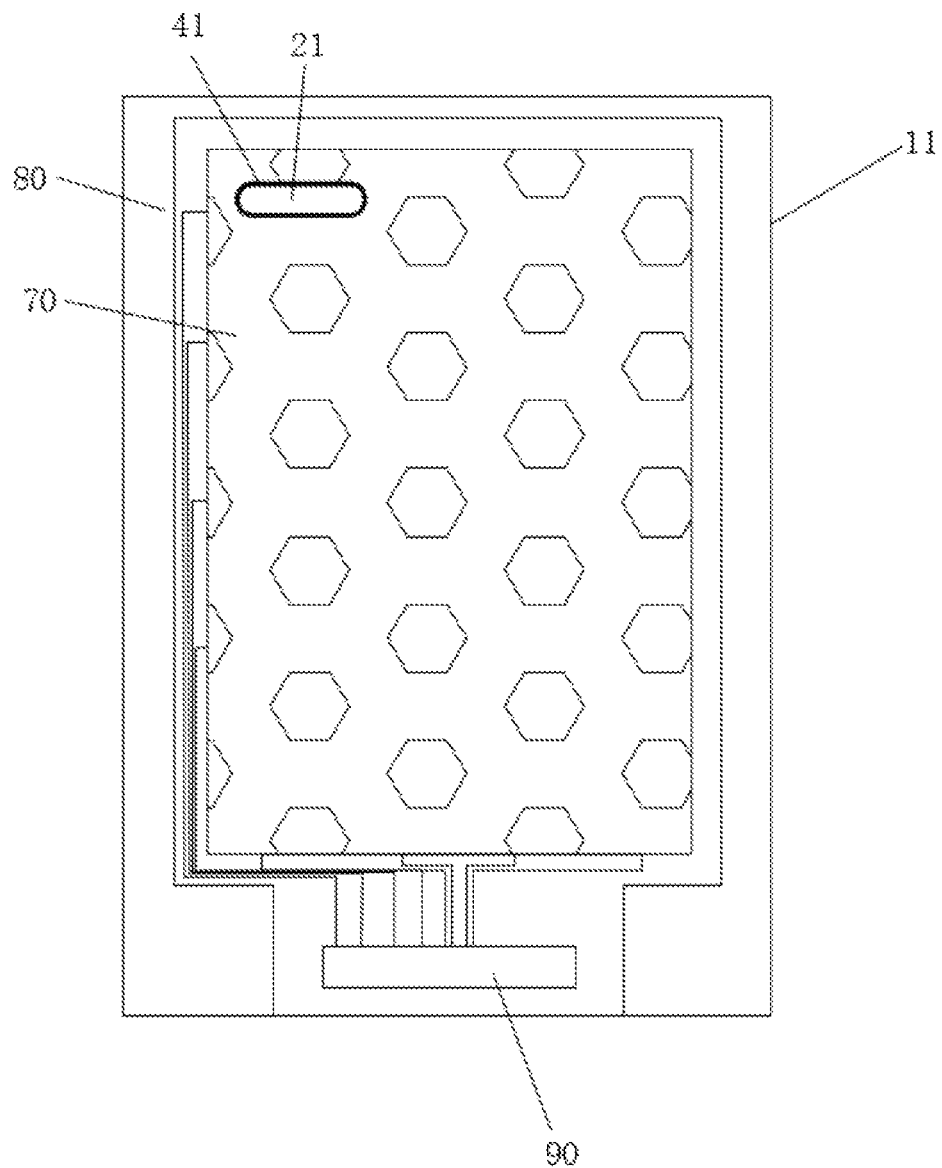
FIG. 4 illustrates an overall schematic diagram of a display panel with a strip opening according to an embodiment of the present disclosure.

Further, in an optional embodiment, as shown in FIG. 4, the opening area 20 may also be a strip hole area, at this time, the cutting remaining area 30 and the first anti-crack area is a circle of strip area that surrounds the opening area 20 in turn. The strip hole is a closed-shaped hole enclosed by two groups of connected straight sections and arc parts. In an optional embodiment, the shape of the opening 21 may also be runway-shaped.

Figure 5:
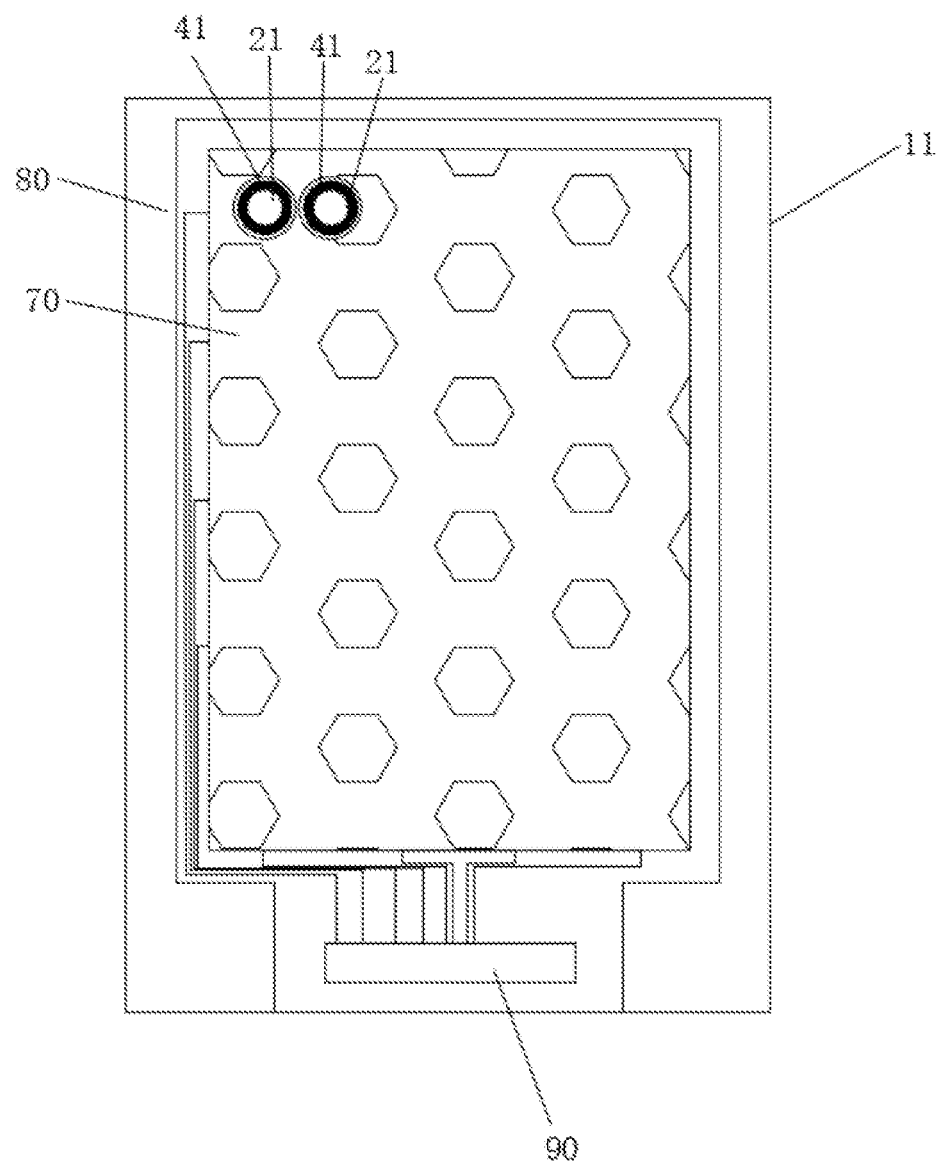
FIG. 5 illustrates an overall schematic diagram of a display panel with two openings according to an embodiment of the present disclosure.

In an optional embodiment, as shown in FIG. 5, the opening area 20 may also provide two openings 21, the area between the active area 70 and the two openings 21 is the first anti-crack area 40. In some other embodiments, a larger number of openings 21 may be set within the opening area 20.

Among them, the display panel in the first anti-crack area 40 further includes: the substrate 11, the encapsulation layer 12 located on the substrate 11, and at least one circle of anti-crack protective layer 41 located on the encapsulation layer 12.

Further, if the opening 21 is a concave hole, the outer surface of the opening of the concave hole may be flush with the surface of the encapsulation layer 12 away from the substrate 11, or it may be flush with the surface of the substrate 11 away from the encapsulation layer 12.

Thereinto, the encapsulation layer 12 may include a first inorganic encapsulation film, an organic encapsulation film and a second inorganic encapsulation film stacked in succession, the first inorganic encapsulation film and the second inorganic encapsulation film may be obtained by twice chemical vapor deposition, respectively, and may also be formed by physical vapor deposition process. Materials of the first inorganic encapsulation film and the second inorganic encapsulation film may be silicon nitride, silicon oxide and other inorganic materials. The organic encapsulation film is made by inkjet printing process, and may also be formed by spraying process, and a material of the organic encapsulation film may be acrylic-based polymer, silicon-based polymer and other materials. The encapsulation layer 12 of the first anti-crack area 40 may be a part of the encapsulation layer of the entire display panel, the encapsulation layer 12 at this position may extend to the cutting remaining area 30 in the direction towards the opening area 20, and may also extend to the active area 70 of the display panel to package circuit components of the entire display panel on the entire substrate 11, protect the circuit components from water vapor and oxygen, and thus forming structural protection for the entire display panel.

Thus, corresponding to an extension of the encapsulation layer 12, the substrate 11 located at the first anti-crack area 40 may also be a part of the substrate of the entire display panel, the substrate 11 at this position may extend in the direction towards the opening area 20 to the cutting remaining area 30, and may also extend to the active area 70 of the display panel.

Thereinto, on the one hand, the anti-crack protective layer 41 is used to block the cracks generated by cutting the opening area 20, and prevent the cracks of the encapsulation layer 12 caused by the cutting during digging from spreading to the active area and the encapsulation layer 12 of the touch area of the display panel, thus avoiding damage to the inner luminescent layer and the touch electrode layer protected by the encapsulation layer 12. On the other hand, the anti-crack protective layer 41 is disposed in the same layer as the touch electrode layer 71 corresponding to the active area, and the materials of them may be consistent, and in the preparation, they may also be formed synchronously. Thus, in the embodiment of the present disclosure, the anti-crack protective layer 41 may be consistent with the touch electrode layer, and may be a metal material, thus meeting the requirements of material ductility for crack prevention of the hole digging edge.

Referring to FIG. 1, in order to get rid of the dependence of the entire display panel on additional touch function components, in the embodiment of the present disclosure, the display panel in one side of the first anti-crack area 40 away from the opening 21 further includes an active area 70; the active area 70 includes at least one layer of touch electrode layer 71, the touch electrode layer 71 includes a touch metal layer, and the anti-crack protective layer 41 includes at least one layer of metal.

The touch electrode layer 71 is used to implement the touch function of the active area 70 of the display panel, and the active area 70 overlaps or partially overlaps touch areas of the display panel.

In order to further facilitate the preparation of the touch electrode layer 71 and the anti-crack protective layer 41, the anti-crack protective layer 41 and at least one touch electrode layer 71 are disposed in the same layer and with the same material in the display panel.

Disposed in the same layer and with the same material refers to that the anti-crack protective layer 41 and at least one touch electrode layer 71 are in the same layer in a hierarchical structure of the display panel and the preparation materials of them are the same. Further, the anti-crack protective layer 41 and at least one layer of the touch electrode layers 71 may be formed by the same process during the preparation and does not limit or require that the anti-crack protective layer 41 and at least one layer of the touch electrode layers 71 are in the same plane in a vertical direction relative to a plane of the substrate 11, i.e., in a direction perpendicular to the plane of the substrate 11. The distance between the anti-crack protective layer 41 and the substrate 11 may be different from the distance between at least one touch electrode layer 71 and the substrate 11.

In the embodiment of the present disclosure, the anti-crack protective layer 41 may be a corresponding layer of the touch electrode layer 71 prepared based on the FMLOC technology, that is, formed in the same layer. Therefore, the present disclosure may be regarded as using the metal layer of the touch control display integrated touch pattern to prepare the anti-cracking structure around the digging holes. Certainly, this may also facilitate further unify the touch function of the active area 70 and the non-active area of the display panel through the functional setting of the anti-crack protection layer 41.

Figure 6:
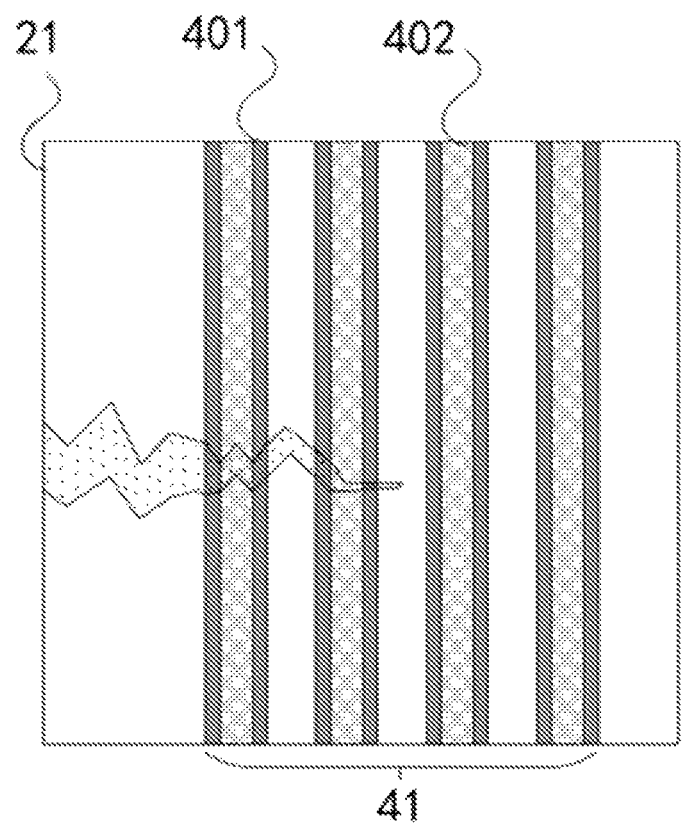
FIG. 6 illustrates a crack blocking schematic diagram according to an embodiment of the present disclosure.

Referring to FIG. 6, FIG. 6 is a crack blocking schematic diagram provided by the embodiment of the present disclosure. As shown in FIG. 6, by the above embodiments, the display panel provided by the embodiment of the present disclosure, in the first anti-crack area 40 surrounding the cutting area of the opening area 20 is provided with at least one circle of anti-crack protective layer 41, the anti-crack protective layer 41 is ring-shaped around the holes, when the diffusion of the encapsulation layer 12 crack generated from the edge area of the holes encounters the anti-crack protective layer 41 made by metal, the metal wiring of the anti-crack protective layer 41 may conduct and disperse the stress of the edge crack of the opening 21 through at least one circle of anti-crack protective layer 41, the diffusion ability of the cracks in the original direction will gradually decay until it disappears. So that the display panel based on the good ductility of the metal material of the anti-crack protective layer 41 may prevent the cracks on the edge of the holes caused by cutting the opening area 20 from spreading to the active area and the touch area of the display panel, thus effectively improving the crack resistance of the active area and the touch area of the display panel, and ensuring the display effect and the touch function of the display panel.

In an optional embodiment, the present disclosure also provides a display panel, in the display panel, the substrate 11 and the encapsulation layer 12 extend to the active area 70.

Corresponding to the hierarchy where the anti-crack protective layer 41 is located, the touch electrode layer 71 is located at one side of the encapsulation layer 12 away from the substrate 11.

For example, the touch metal layer of the touch electrode layer 71 of the active area 70 may be located above the encapsulation layer 12 in a position area of the active area 70, it may be in contact with a surface of the side of the encapsulation layer 12 away from the substrate 11; then the anti-crack protective layer 41 may also correspond to an upper side of the encapsulation layer 12 located in the position area of the first anti-crack area 40, and correspondingly may be in contact with a surface of the side of the encapsulation layer 12 away from the substrate 11.

Figure 7:
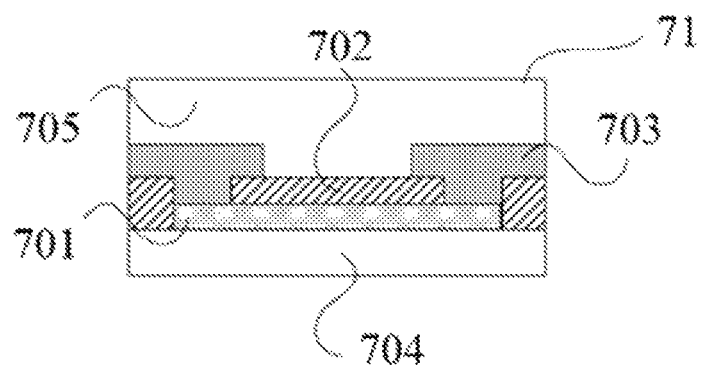
FIG. 7 illustrates a cross-sectional schematic diagram of a touch electrode layer according to an embodiment of the present disclosure.

Referring to FIG. 7, FIG. 7 is a cross-sectional schematic diagram of the touch metal layer provided by the embodiment of the present disclosure. As shown in FIG. 7, in an optional embodiment, the present disclosure further provides a display panel, in the display panel, the at least one touch electrode layer 71 includes a first touch metal layer 701, a second touch metal layer 703, and a touch medium layer 702 between the first touch metal layer 701 and the second touch metal layer that are stacked. Among them, the first touch metal layer 701 is disposed between the second touch metal layer 703 and the substrate 11, i.e., the first touch metal layer 701 is closer to the substrate 11, while the second touch metal layer 703 is closer to the encapsulation layer 12 compared with the first touch metal layer 701.

Specifically, the anti-crack protective layer 41 and the first touch metal layer 701 may be disposed in the same layer and with the same material, or, the anti-crack protective layer 41 and the second touch metal layer 703 may be disposed in the same layer and with the same material. That is, when preparing the display panel, the anti-crack protection layer 41 and the first touch metal layer 701 may be formed in the same process, and the anti-crack protection layer 41 and the second touch metal layer 703 may also be formed in the same process.

Specifically, the touch electrode layer 71 may be used as a signal line of the touch pattern on a surface of the display panel, and for transmitting a touch signal, to respond to the external touch action of the display device where the display panel is located, thus realizing the touch function of the display panel.

The first touch metal layer 701 may be a bridging layer, that is, as a part of the wiring bridging the touch electrode, and the second touch anti-crack layer 703 may be an electrode pattern layer, that is, as a part of the wiring of the touch electrode.

Further, in order to realize the roles of the first touch metal layer 701 and the second touch anti-crack layer 703, respectively, the touch medium layer 702 is provided with through-holes for connecting the first touch metal layer 701 and the second touch metal layer 703.

Further, on the side of the first touch metal layer 701 away from the second touch metal layer 703, a touch substrate layer 704 is also provided for isolating and protecting the first touch metal layer 701. On the side of the second touch metal layer 703 away from the first touch metal layer 701, a touch protection layer 705 is also provided for isolating and protecting the second touch metal layer 703.

As shown in FIG. 7, the through-hole in the touch medium layer 702 may be used to form a metal structure integrated with the second touch metal layer 703 in the through-hole when forming the second touch metal layer 703, the metal structure may be connected with the first touch metal layer 701 to achieve the electrical connection. Thus, making the first touch metal layer 701 and the second touch metal layer 703 cooperate to achieve touch functions.

Specifically, the touch medium layer 702 may be selected with inorganic materials, such as $SiO_2$ or $SiN_x$. The touch medium layer 702 may also use organic materials, such as resin or UV glue. In the embodiment of the present disclosure, which is not specifically limited.

In an optional embodiment, the touch medium layer 702 may also be not disposed between the first touch metal layer 701 and the second touch metal layer 703.

Figure 8:
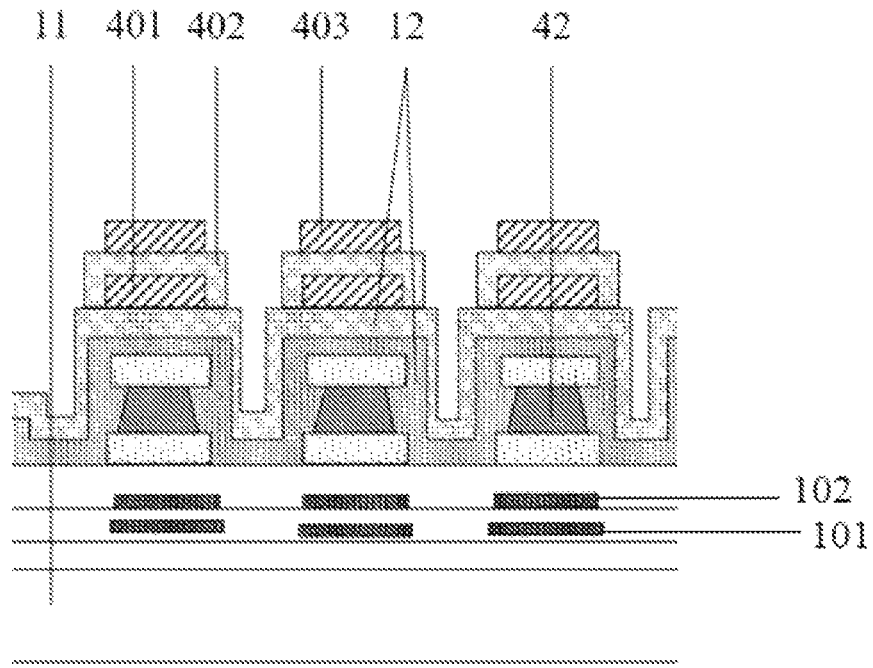
FIG. 8 illustrates a schematic diagram of a first mode distribution of an anti-crack protective layer according to an embodiment of the present disclosure.
Figure 10:
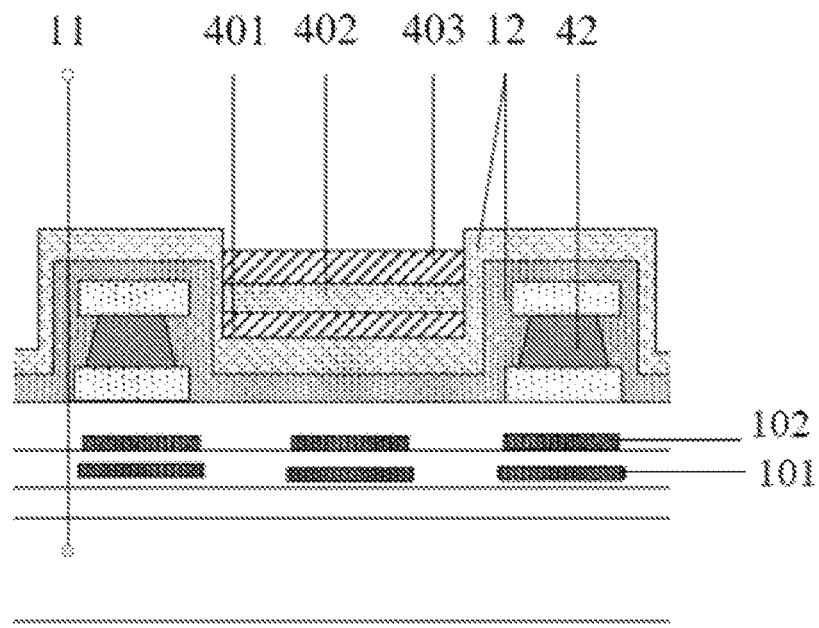
FIG. 10 illustrates a schematic diagram of a second mode distribution of an anti-crack protective layer according to an embodiment of the present disclosure.

Referring to FIG. 8, FIG. 8 is a schematic diagram of a first mode distribution of a two-layer anti-crack protective layer provided by the embodiment of the present disclosure. Alternatively, referring to FIG. 10, FIG. 10 is a schematic distribution of a second mode distribution of a two-layer anti-crack protective layer provided by the embodiment of the present disclosure. As shown in FIG. 8 or FIG. 10, in order to accommodate the formation and hierarchy of the touch electrode layer 71, in an optional embodiment, the present disclosure also provides a display panel, in the display panel, the anti-crack protective layer 41 includes a first anti-crack protective layer 401 and a second anti-crack protective layer 403 that are stacked.

The first anti-crack protective layer 401 is disposed between the second anti-crack protective layer 403 and the substrate 11, the first anti-crack protective layer 401 is disposed between the second anti-crack protective layer 403 and the substrate 11.

A touch insulation layer 402 is provided between the first anti-crack protective layer 401 and the second anti-crack protective layer 403, the touch insulation layer 402 may clad the first anti-crack protective layer 401. The touch insulation layer 402 may electrically insulate and separate the first anti-crack protective layer 401 and the second anti-crack protective layer 403 to make the first anti-crack protective layer 401 and the second anti-crack protective layer 403 perform corresponding electrical functions, respectively.

The first anti-crack protective layer 401 and the first touch metal layer 701 are disposed in the same layer and with the same material, the touch insulation layer 402 and the touch medium layer 702 are disposed in the same layer and with the same material, and the second anti-crack protective layer 403 and the second touch metal layer 703 are disposed in the same layer and with the same material.

Specifically, for the anti-crack protective layer 41 including the first anti-crack protective layer 401 and the second anti-crack protective layer 403, corresponding to the hierarchy of the touch electrode layer 71, a thickness of each circle of anti-crack protective layer 41 may be 0.8 μm to 1.2 μm due to including double-layer stacked metal, such as 0.8 μm, 0.9 μm, 1 μm, 1.1 μm, 1.2 μm, and so on.

By the above embodiments, the anti-crack protective layer 41 including the first anti-crack protective layer 401 and the second anti-crack protective layer 403 may block the crack at the edge of the opening with a double effect, which more effectively prevents the edge crack from spreading to the active area/touch area around the peripheral area of the holes, to ensure the display effect and touch effect of the active area.

Figure 12:
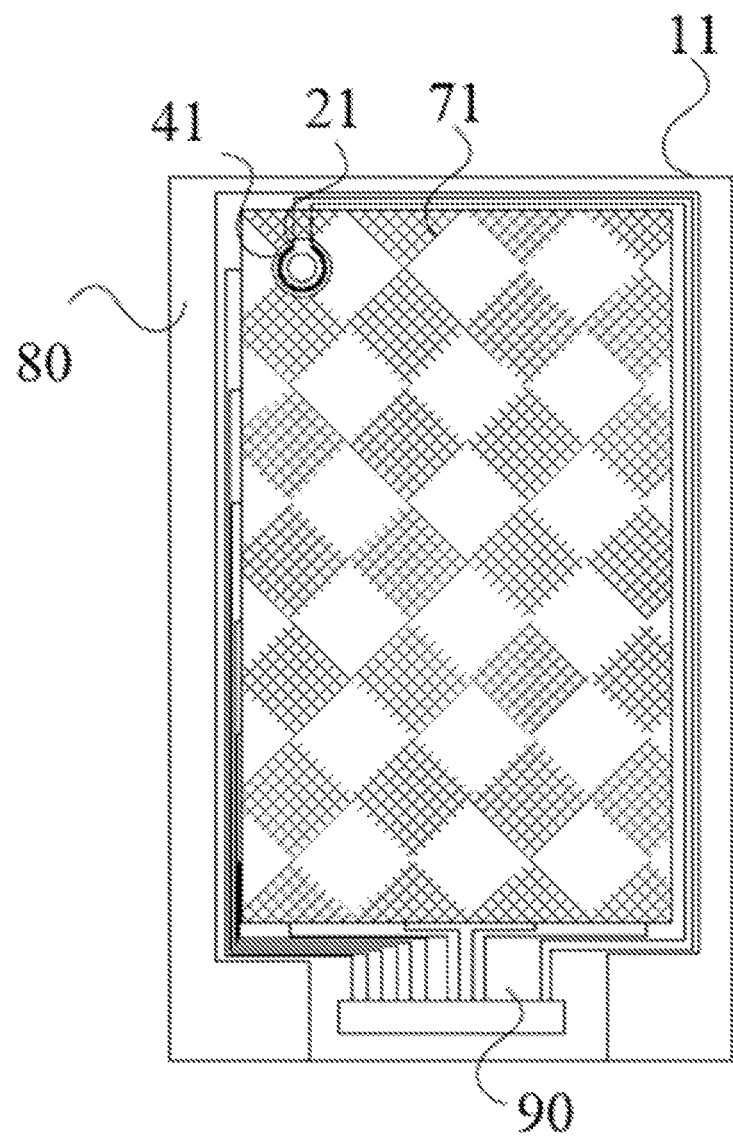
FIG. 12 illustrates a planar schematic diagram of a touch electrode wiring according to an embodiment of the present disclosure.

Referring to FIG. 12, FIG. 12 is a planar schematic diagram of a touch electrode wiring of the anti-crack protective layer provided by the embodiment of the present disclosure. As shown in FIG. 12, the above embodiment proposes to provide a display panel with a touch anti-crack layer 41 disposed in the first anti-crack area 40, which may enhance the anti-crack capability of the peripheral area of the opening area 20 of the display screen. And the touch anti-crack layer 41 may also be used to realize the touch function of the display panel in the peripheral area of the digging holes, thus getting rid of the dependence on additional touch function components.

Same or similar to the touch metal layer 71 of the active area 70, each circle of touch anti-crack layer 41 may be connected to the peripheral electrode or ground electrode by the wiring of the touch electrode in the border area 80. It should be noted that the content provided in FIG. 12 is only for a simple illustration of the connection wiring between the touch anti-crack layer 41 and the electrodes, and does not limit the internal arrangement of the wirings.

For this purpose, in an optional embodiment, the present disclosure also provides a display panel, in the display panel, the first anti-crack protective layer 401 is a part of the wiring of the touch electrode, and the second anti-crack protective layer 403 is a part of the wiring bridging the touch electrodes.

The wiring of the touch electrode, and the wiring bridging the touch electrodes are connected to the touch chip 91, and the touch chip 91 is used to process and respond to the touch signal provided by the wiring.

Among them, the anti-crack protective layer 41 may also be a part of the touch signal line of the touch electrode, and for the display panel, at least the touch signal line corresponding to the active area 70 of the display panel may respond to the touch behavior of the users at the corresponding position of the display panel, thus, the users may control of the corresponding terminal of the display panel, so that the display panel does not need to add additional touch function components. For example, there is no need to provide touch function sensor film or outer glass touch layer, but also provide the touch function around the digging holes of the display panel to ensure the realization of the touch function. Considering that the anti-crack protection layer 41 and the touch signal line of the active area 70 of the display panel may be prepared at the same time, the thickness of at least one circle of anti-crack protective layer 41 in the anti-crack protective layers 41 may be consistent with that of the touch signal line corresponding to the active area 70 of the display panel, specifically, for the anti-crack protective layer 41 of a single-layer metal structure, the thickness of each circle of anti-crack protective layer 41 may be 0.4 μm-0.6 μm.

FIG. 12 simply shows the planar wirings connecting the touch electrodes of the first anti-crack protective layer 701 and the second anti-crack protective layer 703, actually, the wirings of the touch electrodes bridged by the second anti-crack protective layer and the wirings of the touch electrodes of the first anti-crack protective layer may be in different layers in the vertical direction of the display panel. On this basis, the first anti-crack protective layer 401 and the second anti-crack protective layer 403 may also be used to cooperate and implement the touch function of the display panel in the black mask (BM) area around the opening area 20. To enable the first anti-crack protective layer 401 and the second anti-crack protective layer 403 to cooperate and implement the touch function of the first anti-crack area 40, at least one circle of touch insulation layer 402 may also be provided with openings of the first anti-crack protective layer 401 and the second anti-crack protective layer 403 penetrating the circle, the opening is provided with metal lines for connecting the wirings of the first anti-crack protective layer 401 and the second anti-crack protective layer, so that the first anti-crack protective layer 401 and the second anti-crack protective layer 403 may cooperate and implement the touch function of the first anti-crack area 40.

By the above embodiments, the functional relationship between the first touch metal layer 701 and the second touch metal layer 703 in touch electrode layer 71 is used. Corresponding to the touch function of the active area in the touch electrode layer 71 being implemented, the anti-crack protective layer 41 can use the double-layered laminated anti-crack protective layer 41 to realize the touch function of the peripheral area around the digging holes.

In order to facilitate the preparation, the first anti-crack protective layer 401 and the first touch metal layer 701 are formed in the same layer and with the same material, and the touch insulation layer 402 and the touch medium layer 702 are formed in the same layer and with the same material, the second anti-crack protective layer 403 and the second touch metal layer 703 are formed in the same layer and with the same material, and the material, thickness, etc., of the structures formed in the same layer may be the same.

That is, the materials of the first anti-crack protective layer 401 and the first touch metal layer 701 may be the same, the materials of the touch insulation layer 402 and the touch medium layer 702 may be the same, and the materials of the second anti-crack protective layer 403 and the second touch metal layer 703 may be the same. To further facilitate the preparation, the material of the touch insulation layer 402 and the material of the encapsulation layer 12 may be also the same. In order to achieve touch and improve the touch performance, the touch insulation layer 402 may also be a material that is easier to achieve high-precision preparation, and/or, a material with the electrical insulation performance better than the electrical insulation performance of the encapsulation layer 12.

Figure 13:
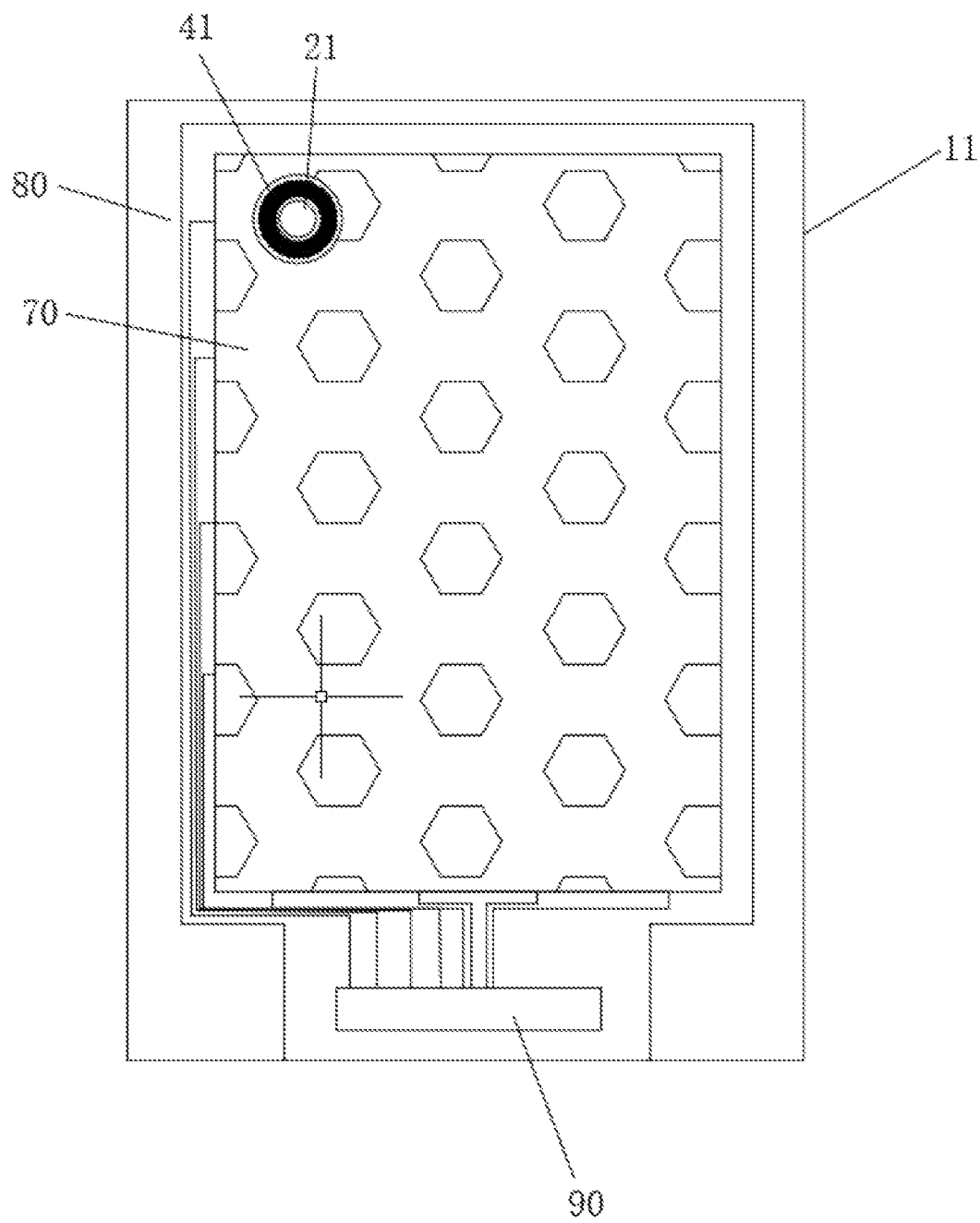
FIG. 13 illustrates an overall schematic diagram of a display panel with an overall anti-crack protective layer according to an embodiment of the present disclosure.

In an optional embodiment, as shown in FIG. 13, the present disclosure also provides a display panel, in the display panel, the first anti-crack protective layer 401 and the second anti-crack protective layer 403 of the anti-crack protective layer 41 are not connected to the outside of the display panel as a PCD cable, i.e., the first anti-crack protective layer 401 and the second anti-crack protective layer 403 are not connected to the wirings of the touch electrodes in the border area 80. And, in this embodiment, the anti-crack protective layer 41 is provided as an integral structure.

Specifically, since the first anti-crack area 40 is a circle of area around the opening area 20, the first anti-crack area 40 has a certain width in the plane direction of the display panel (i.e., a distance between a side of the first anti-crack area 40 close to the opening area 20 and a side of the first anti-crack area 40 close to the active area 70), within this width, the anti-crack protective layer 41 needs to at least partially cover the encapsulation layer 12 in the first anti-crack area, the display panel may include at least one circle of anti-crack protective layer 41 around the opening area.

Referring to FIG. 13, FIG. 13 shows a schematic diagram of a plane structure of a display panel. As shown in FIG. 13, when the anti-crack protective layer 41 is a circular structure, the anti-crack protective layer 41 may be an integral structure. For example, at this time, the width of the anti-crack protective layer 41 in the plane direction of the display panel may be the same as the width of the first anti-crack area 40 in the plane direction of the display panel, so that it may make the anti-crack protective layer 41 completely cover the encapsulation layer 12 in the first anti-crack area 40, thus preventing cracks at the edge of the digging holes caused by cutting the opening area 20 from spreading to the active area and the touch area of the display panel, which may effectively improve the anti-cracking ability of the active area and the touch area of the display panel, and ensure the display effect and the touch function of the display panel.

Figure 14:
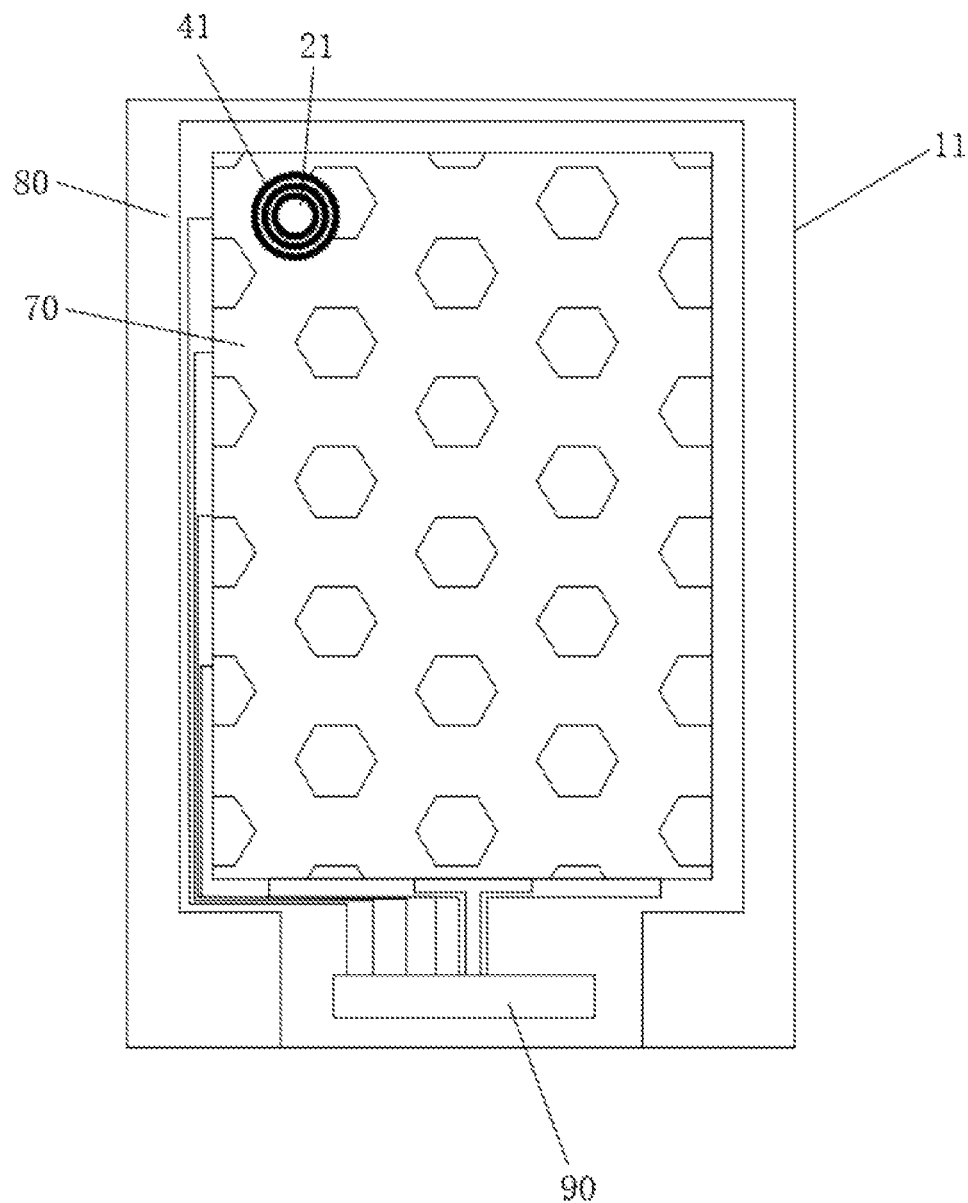
FIG. 14 illustrates an overall schematic diagram of a display panel with a multi-turn anti-crack protective layer according to an embodiment of the present disclosure.

Referring to FIG. 14, FIG. 14 shows a schematic diagram of a planar structure of another display panel. As shown in FIG. 14, when the anti-crack protective layer 41 includes a multiturn structure, each circle of anti-crack protective layer 41 is disposed independently on the encapsulation layer 12. At this time, the anti-crack protective layer 41 includes multiple torus-shaped sections concentric circles spaced out in the same center within the first anti-crack area 40. In FIG. 7, the anti-crack protective layer 41 includes a four-turn structure, hence in the first anti-crack area 40, the anti-crack protective layer 41 shows to be four ring sections distributed in concentric circles with the same center and partially cover the encapsulation layer 12 within the first anti-crack area 40. At this time, multi-turn anti-crack protective layer 41 may further prevent the cracks in opening area 20 from spreading to the active area of the display panel.

The current FMLOC technology directly fabricates the touch signal layer on the display layer and the encapsulation layer 12, comprehensively considering the preparation accuracy, conductivity, material ductility, cost, process maturity and other factors, titanium-aluminum-titanium (Ti—Al—Ti) is usually used as the touch functional material.

Titanium-aluminum-titanium is a three-layer metal laminated film, including an upper layer of titanium or a titanium base layer mainly composed of titanium, a middle aluminum metal layer composed of aluminum or mainly composed of aluminum, and a titanium based metal layer as the lower layer composed of titanium or mainly composed of titanium. In the three-layer metal laminated film of titanium-aluminum-titanium, the titanium film may prevent the oxidation of the aluminum layer, and the aluminum film is used as a conductive material for the transmission of electrical signals.

Considering the small width of the hole digging BM area, a high accuracy of the anti-crack protective layer 41 is required, and the material of the anti-crack protective layer 41 needs to have high ductility to prevent the cracks of the encapsulation layer 12 to spread from the hole digging area to the active area and the touch area, so the anti-crack protective layer 41 may also be a metal material that comprehensively considers the preparation accuracy and ductility, and is not limited to titanium-aluminum-titanium.

The above embodiment has been mentioned that the present disclosure uses the preparation and formation of the touch electrode layer 71 of the active area 70 to realize the hierarchy of the anti-crack protective layer at the periphery position of the digging holes, and the edge crack of the digging holes is blocked. Thus, in an optional embodiment, corresponding to the hierarchy of the anti-crack protective layer 41, the anti-crack protective layer includes a single-layer or tandem structure of metal or metal oxide.

Further, in an optional embodiment, the metal includes at least one of the following: copper, molybdenum, titanium-aluminum-titanium; and the metal oxide includes: indium tin oxide.

Further, considering that the roles of the touch signal lines of the active areas corresponding to the first anti-crack protective layer 401 and the second anti-crack protective layer 403, respectively, for implementing the touch functions of the entire anti-crack protective layer 41 are different, in order to improve the touch performance and crack blocking ability of the anti-crack protective layer 41, in an optional embodiment, the present disclosure provides a display panel, and in the display panel, the materials of the first anti-crack protective layer 401 and the second anti-crack protective layer 402 are different from each other. That is, the materials of the first anti-crack protective layer 401 and the second anti-crack protective layer 403 in the same circle may be different from each other. And the materials of the first anti-crack protective layer 401 and the second anti-crack protective layer 402 may be two materials with different electrical properties.

For example, the first anti-crack protective layer 401 may be made of indium tin oxide, and the second anti-crack protective layer 403 may be made of titanium-aluminum-titanium.

Further, the first anti-crack protective layer 401 and the second anti-crack protective layer 403 have an upper and lower layer relationship on the insulation layer of the first anti-crack area 40, and play different roles during blocking cracks. So, the materials of the first anti-crack protective layer 401 and the second anti-crack protective layer 403 may also be two materials with different ductility.

For example, the first anti-crack protective layer 401 may be made of molybdenum, and the second anti-crack protective layer 403 may be made of indium tin oxide.

Considering that there are numerous components between the encapsulation layer 12 and the substrate 11 of the active area 70 of the display panel, and in the embodiment of the present disclosure, the first anti-crack area 40 is a part of the BM area, and since there is no need to provide display functions, in the first anti-crack area 40, mainly only the substrate 11 and the encapsulation layer 12 takes up more space, and there are more "vacant" spaces in the first anti-crack area 40 of the display panel. In order to make full use of the "vacant" space and to achieve blocking of cracks, in an optional embodiment, the present disclosure further provides a display panel, in the first anti-crack area 40 of the display panel, at least one circle of first anti-crack dam 42 is provided between the substrate 11 and the encapsulation layer 12.

The first anti-crack dam 42 may be a metal material for the first anti-crack area 40 to further prevent the cracks of the opening edge from spreading in the direction towards the active area 70.

The first anti-crack dam 42 and the anti-crack protective layer 41 are distributed at both sides of the encapsulation layer 12 in the first mode and/or the second mode.

Specifically, at least one circle of anti-crack protective layer 41 may be disposed at a position area corresponding to the multi-turn first anti-crack dam 42 on the encapsulation layer 12. Further, the position area corresponding to the multi-turn first anti-crack dam 42 may be the upper orientation of the first anti-crack dam 42 away from the substrate 11, or it may also be a lateral orientation of the first anti-crack dam 42 pointing to the opening area 20 or the active area 70.

Specifically, the number of turns of the anti-crack protective layer 41 may be the same as that of the first anti-crack dam 42 to reduce the difficulty of preparation and manufacturing, and improve the effect of blocking cracks. The number of turns of the anti-crack protective layer 41 may also be different from the first anti-crack dam 42 to achieve the wiring with specific touch graphics and realize the corresponding touch function in the peripheral area around the digging holes.

In the embodiment of the present disclosure, by distributing at least one circle of anti-crack protective layer 41 and the first anti-crack dam 42 at two sides of the encapsulation layer 12, which may be combined with the first anti-crack dam 42 to prevent the cracks of the openings 21 of the display panel from spreading to the direction towards the active area 70, which helps to improve the crack blocking effect.

Figure 9:
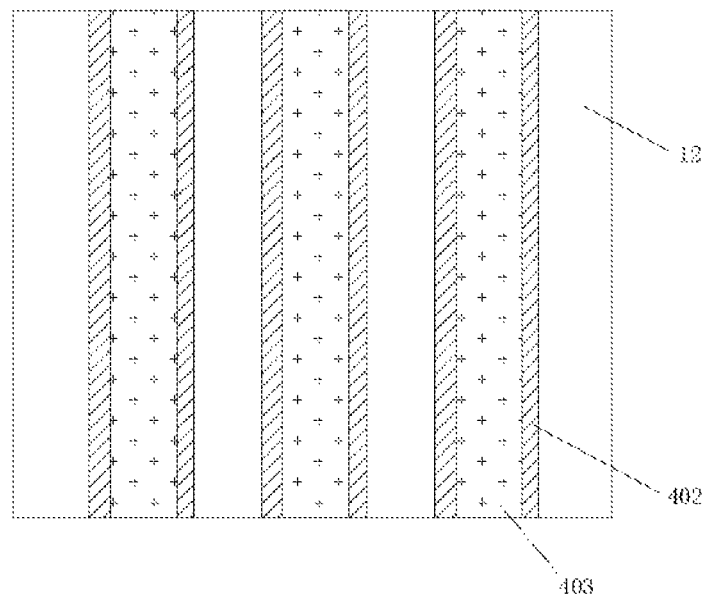
FIG. 9 illustrates a planar schematic diagram of the first mode distribution of the anti-crack protective layer according to an embodiment of the present disclosure.

As shown in FIG. 8 and FIG. 9, in order to further enhance the crack blocking effect, in an optional embodiment, the present disclosure further provides a display panel, in the display panel, the first anti-crack dam 42 and the anti-crack protective layer 41 are distributed on both sides of the encapsulation layer 12 in the first mode, and the first mode is: the first anti-crack dam 42 and the anti-crack protective layer 41 stacked on both sides of the encapsulation layer 12, and an orthographic projection of the first anti-crack dam 42 on the substrate 11 at least partially covers an orthographic projection of the anti-crack protective layer 41 on the substrate 11.

Further, referring to FIG. 8 and FIG. 9, the orthographic projection of the first anti-crack dam 42 on the substrate 11 may completely cover the orthographic projection of the anti-crack protective layer 41 on the substrate 11, and, a central position of the orthographic projection of the first anti-crack dam 42 on the substrate 11 may coincide with a central position of the orthographic projection of the anti-crack protective layer 41 on the substrate 11.

Further, referring to FIG. 8 and FIG. 9, each circle of anti-crack protective layer 41 may be disposed in a first area on the encapsulation layer 12, and the first area is a position area right facing an upright orientation of the first anti-crack dam 42, so that the anti-crack protective layer 41 and the first anti-crack dam 42 symmetrically arranged on the upper and lower sides of the encapsulation layer 12.

The upright orientation refers to an orientation away from substrate 11 in the direction perpendicular to a horizontal plane with taking a surface of the substrate 11 as the horizontal plane.

By the embodiment of the present disclosure, a circle of anti-crack protective layer 41 and the first anti-crack dam 42 are set as projections coincide relationship, so that each circle of anti-crack protective layer 41 may regularly form at least one group of first anti-crack combination units with the first anti-crack dam 42 below this circle of anti-crack protective layer 41, such a first anti-crack combination unit forms "multiple high walls" preventing the cracks of the openings 21 mainly in the encapsulation layer 12 from spreading, which may enhance the ability to block cracks mainly caused by the encapsulation layer 12 and improve the anti-crack effect of the display panel.

Figure 11:
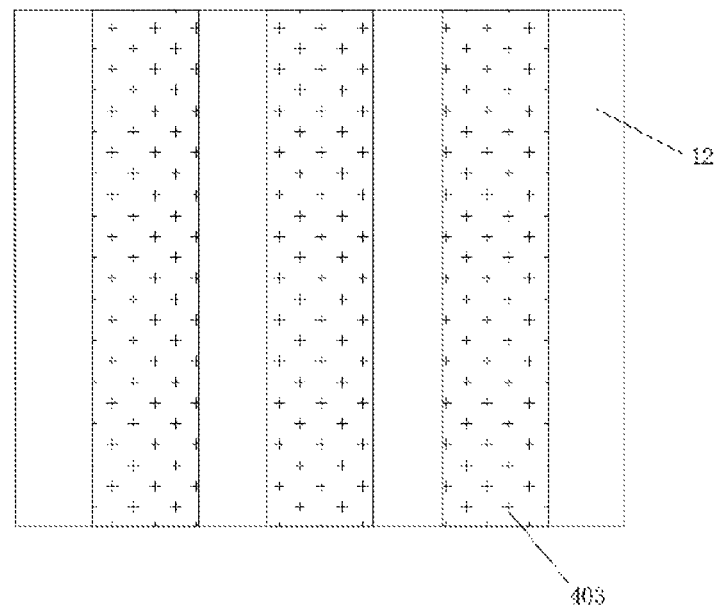
FIG. 11 illustrates a planar schematic diagram of the second mode distribution of the anti-crack protective layer according to an embodiment of the present disclosure.

As shown in FIG. 10 and FIG. 11, in an optional embodiment, the present disclosure further provides a display panel, in the display panel, the first anti-crack dam 42 and the anti-crack protective layer 41 are distributed on both sides of the encapsulation layer 12 in a second mode. The second mode is: the first anti-crack dam 42 and the anti-crack protective layer 41 dislocated on both sides of the encapsulation layer 12, the orthographic projection of the anti-crack protective layer 41 on the substrate 11 is located between orthographic projections of two adjacent first anti-crack dams 42 on the substrate 11.

Further, referring to FIG. 10 and FIG. 11, the center position of the orthographic projection of the anti-crack protective layer 41 on the substrate 11 may coincide with the central position of the orthographic projection of a gap constituted by two adjacent first anti-crack dams 42 on the substrate 11.

Further, referring to FIG. 10 and FIG. 11, each turn of the anti-crack protective layer 41 may be disposed at a second area on the encapsulation layer 12. Among them, the second area is an area corresponding to the gap formed by two adjacent circles of first anti-crack dams 42, so that the anti-crack protective layer 41 and the first anti-crack dam 42 are staggered on both sides of the encapsulation layer 12.

Thereinto, the area corresponding to the gap formed by two adjacent circles of first anti-crack dams 42 refers to the gap formed between the encapsulation layers 12 between two adjacent circles of first anti-crack dams 42.

By the embodiment of the present disclosure, the projection of the interval area of the anti-crack protective layer 41 and the first anti-crack dam 42 is provided to be coincided, so that each circle of anti-crack protective layer 41 may regularly form a "sandwich" second anti-crack combination unit with two adjacent circles of first anti-crack dams 42 on the left and right, such a second anti-crack combination unit forms "a thick wall" preventing the spread of the cracks of the opening 21 mainly in the encapsulation layer 12, which can enhance the ability to block cracks and improve the anti-cracking effect of the display panel.

Further, in order to facilitate to meet the routing requirements and/or crack blocking requirements of the touch electrode of the anti-crack protective layer 41, in an optional embodiment, the present disclosure also provides a display panel, in the display panel, the first anti-crack dam 42 and the anti-crack protective layer 41 distributed on both sides of the encapsulation layer 12 in the first mode and the second mode. Among them, the first anti-crack dam 42 and the anti-crack protective layer 41 with partial turns are distributed on both sides of the encapsulation layer 12 in the first mode, and the first anti-crack dam 42 with the anti-crack protective layer 41 with the remaining turns are distributed on both sides of the encapsulation layer 12 in the second mode.

Specifically, a target anti-crack protective layer 41 in at least one circle of anti-crack protective layer 41 is disposed in the first area of the encapsulation layer 12. Among them, the target anti-crack protective layer 41, that is, the anti-crack protective layer with partial turns. The first area is a position area right facing an upright orientation of the first anti-crack dam 42, and the target anti-crack protective layer 41 is the touch anti-crack layers 41 of partial turns of the at least one circle of anti-crack protective layer 41. And, the remaining anti-crack protective layers 41 other than the target anti-crack protective layer 41 in the at least one circle of anti-crack protective layer 41 are disposed on the second area on the encapsulation layer 12, the second area is an area corresponding to the gap formed by two adjacent circles of first anti-crack dams 42, so that each circle of anti-crack protective layer 41 of the remaining portion and the first anti-crack dam 42 are staggered on both sides of the encapsulation layer 12.

By the embodiment of the present disclosure, the first anti-crack dam 41 is distributed simultaneously in the first and second modes on both sides of the encapsulation layer 12, then part number of the turns of the target anti-crack protective layers 41 are distributed in the first mode, and can be kept at the position further away from the substrate 11 relative to the remaining anti-crack protective layer 41, based on the position relationship, specific touch pattern routing requirements and/or crack blocking requirements in the peripheral area around the opening area 20 may be satisfied, meanwhile, the anti-crack protective layer 41 and the first anti-crack dam 42 distributed in two distribution modes form a combination of upper and lower position relationships or staggered combinations, which can also enhance the ability to block cracks and improve the anti-cracking effect of the display panel.

There are differences in the degree of edge fragmentation caused by hole cutting of the display panel, in some more extreme scenarios, if the crack spreads inward, the encapsulation layer 12 at the position of the opening 21 of the display panel and the substrate 11 may even disconnect, while the metal ductility of the anti-crack protective layer 41 is limited. In this case, the touch function provided by the anti-crack protective layer 41 are vulnerable to breakage. In order to further improve the anti-crack effect of the display panel, and also to prevent the anti-crack protective layer 41 from being damaged and affecting the touch function of the peripheral area around the opening area 20. In an optional embodiment, the present disclosure also provides a display panel, in the first anti-crack area 40 of the display panel, the substrate 11 and the encapsulation layer 12 extend to the cutting remaining area 30. The display panel further includes a concave-convex structure 31, the concave-convex structure 31 is located between the encapsulation layer 12 in the cutting remaining area 30 and the substrate 11.

The concave-convex structure 31 may be at least one circle, and at least one circle of concave-convex structure 31 may be distributed sequentially around the opening area 20. The concave-convex structure 31 includes a first concave-convex structure, the minimum spacing of the first concave-convex structure to the opening 21 is 0 micron to 30 microns, at least one of the concave-convex structure 31 has a surface away from the substrate 11, and a side connected to the surface, at least one of the surface and the side is concave-convex shaped, the first concave-convex structure is the concave-convex structure 31 with the smallest distance from the center of the opening area 20.

By the embodiment of the present disclosure, a display panel is provided, the display panel is provided with a concave-convex structure 31 in the cutting remaining area 30 closer to the opening 21 than the first anti-crack area 40, which can better cope with the damage to the anti-crack protective layer 41 caused by the fracture of the opening 21 under extreme conditions, and enhance the anti-cracking ability of the excavated edge of the display panel. In the case that the anti-crack protective layer 41 is used for implementing the touch function of the peripheral area of the opening area 20, the touch function of the display panel at the peripheral area of the opening area 20 may be ensured.

For the anti-crack protective layer 41, in addition to dealing with chipping that may come from the direction of the opening area 20, it is also necessary to deal with ink spillage from the direction of the active area 70, for this purpose, referring to FIG. 3, in an optional embodiment, the present disclosure further provides a display panel, the display panel further includes: a stop zone 50 surrounding the first anti-crack area 40.

The substrate 11 and the encapsulation layer 12 extend to the stop zone 50, a stop dam 51 is provided between the encapsulation layer 12 and the substrate 11 that are located in the stop zone 50.

Specifically, the stop dam 51 may be multi-turn, and the multi-turn stop dam 51 may be distributed sequentially surrounding the first anti-crack area 40.

By the embodiment of the present disclosure, a display panel is provided, the display panel provides the multi-turn stop dam 51 in the direction from the first anti-crack area 40 to the active area 70, which can prevent the ink spillage of the display panel and avoid damaging the appearance and function of the display panel, and can also avoid affecting the implementation of touch function of the anti-crack protection layer 41 in the case that the touch anti-crack layer is used to realize the touch function of the peripheral area of the opening area 20.

In order to further match with the anti-crack protective layer 41 to achieve stronger crack resistance of the display panel, with reference to FIG. 3, in an optional embodiment, the present disclosure also provides a display panel, and the display panel further includes: a second anti-crack area 60 surrounding the stop zone 50; the display panel in the second anti-crack area 60 further includes: the substrate 11, the encapsulation layer 12 located on the substrate 11, and a second anti-crack dam 61 between the encapsulation layer 12 located in the second anti-crack area 60 and the substrate 11.

Among them, the second anti-crack dam 61 can be multi-turn, and the multi-turn second anti-crack dam 61 can be distributed sequentially surrounding the stop zone 50. And, orthographic projections of the anti-crack protective layer 41 and the first anti-crack dam 42 and/or the second anti-crack dam 61 on substrate 1 have at least partially overlapping areas.

By the embodiment of the present disclosure, a display panel is provided, the display panel is provided with a multi-turn second anti-crack dam 61 at a position area closer to the active area 70, not only can cooperate with the anti-crack protective layer 41 to further provide a blocking effect to the spread of the cracks of the opening 20 to the active area 70, but also can deal with fragments of the display panel from the active area 70 to prevent the cracks from spreading further towards the opening area 20 where the anti-crack protective layer 41 is located, to prevent damage to anti-crack protective layer 41, which can ensure the touch function of the surrounding area of the opening area 20 of the display panel, in the case that the anti-crack protective layer 41 is used to implement the touch function of the peripheral area of the opening area 20.

In an optional embodiment, as shown in FIG. 8 or FIG. 10, the present disclosure further provides a display panel, the display panel in the first anti-crack area 40 further includes: at least one layer of metal layers located between the encapsulation layer and the substrate.

Specifically, referring to FIG. 8 and FIG. 10, in FIG. 8 and FIG. 10, the at least one layer of metal layers includes a first metal layer 101 and a second metal layer 102, the first metal layer 101 is located between the second metal layer 102 and the substrate 11, the first metal layer 101 is regarded as an electrode layer and the second metal layer 102 is regarded as a bridging layer. And, orthographic projections of the first metal layer 101 and the second metal layer 102 on the substrate and an orthographic projection of the anti-crack protective layer 41 on the substrate 11 at least partially overlap.

By the embodiment of the present disclosure, a display panel is provided, the display panel also provides a first metal layer 101 and a second metal layer 102 between the encapsulation layer 12 of the first anti-crack area 40 and the substrate 11, which can be more conducive to implementing the touch function of the peripheral area of the opening area 20 of the anti-crack protective layer 41 by using the first metal layer 101 and the second metal layer 102.

Figure 15:
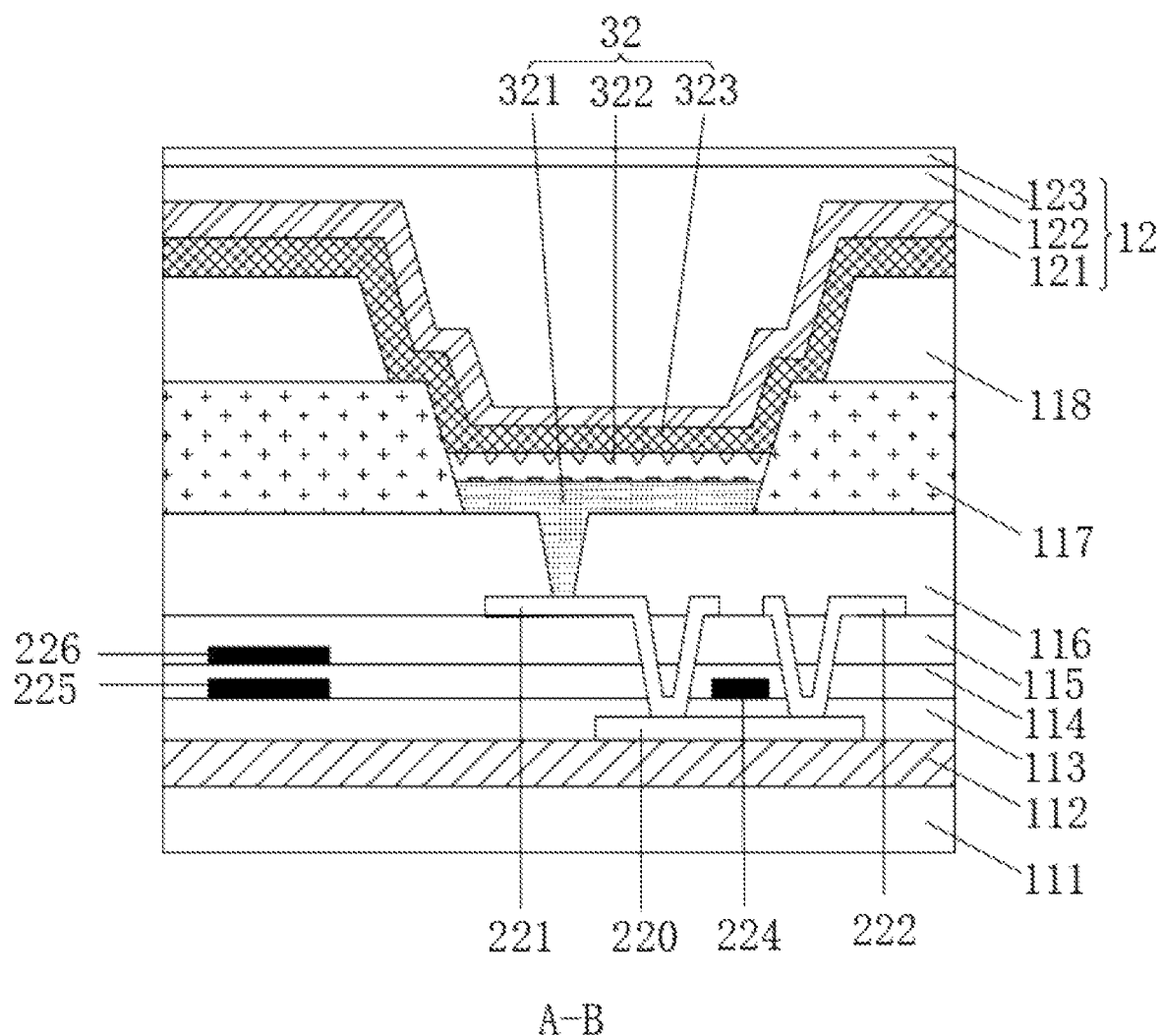
FIG. 15 illustrates a cross-sectional schematic diagram of a display panel in an A-B direction according to an embodiment of the present disclosure.

In an optional embodiment, as shown in FIG. 15, the present disclosure further provides a display panel, the display panel in the active area 70 also includes: a driving circuit layer and a luminescent layer 32 stacked between the substrate 11 and the encapsulation layer 12.

Specifically, the part of the driving circuit layer located in the active area 70 may include a thin-film transistor and a capacitor structure.

As shown in FIG. 15, the thin-film transistor may be a top-gate type, and the thin-film transistor may include an active layer 220, a first gate insulation layer 113, a gate 224, a second gate insulation layer 114, an interlayer dielectric layer 115, a source 222, and a drain 221. Specifically, the active layer 220 may be formed on the buffer layer 112, the first gate insulation layer 113 covers the buffer layer 112 and the active layer 220, the gate 224 formed on a side of the first gate insulation layer 113 away from the active layer 220, the second gate insulation layer 114 covers the gate 224 and the first gate insulation layer 113, and the interlayer dielectric layer 115 covers the second gate insulation layer 114, the source 222 and the drain 221 are formed on sides of the interlayer dielectric layer 115 away from the substrate 11 and are located on opposite sides of the gate 224, respectively, the source 222 and the drain 221 may be in contact with the opposite sides of the active layer 220 through via holes (e.g., metal via holes), respectively. It should be understood that the thin-film transistor can also be a bottom-gate type.

As shown in FIG. 15, the capacitor structure may include a first plate 225 and a second plate 226, the first plate 225 and the gate 224 is arranged in the same layer, the second plate 226 is located between the second gate insulation layer 114 and the interlayer dielectric layer 115, and is disposed relative to the first plate 225.

For example, the materials of the gate 224 and the first plate 225, the second plate 226 may include metal materials or alloy materials, such as molybdenum, aluminum and titanium. The source 222 and the drain 221 may include metal materials or alloy materials, such as metal monolayer or multilayer structures formed by molybdenum, aluminum and titanium, for example, the multilayer structure is a multi-metal laminated layer, such as a three-layer metal laminated layer of titanium, aluminum, titanium (Al/Ti/Al) and the like.

As shown in FIG. 15, the luminescent layer 32 includes a first pixel electrode 321 and a pixel definition portion 117 sequentially formed on the interlayer dielectric layer. It should be understood that the display device may further include a light-emitting portion 322 and a second pixel electrode 323.

Specifically, when the thin-film transistor in the active area 70 is a top-gate type, a planarization layer 116 may also be made before making the display device, and the planarization layer may be a single-layer structure or a multi-layer structure. The planarization layer is usually made of organic materials such as photoresists, acrylic-based polymers, silicone-based polymers, etc.; as shown in FIG. 13, the planarization layer 116 may include a planarization portion located in the active area 70, the planarization portion is formed between the interlayer dielectric layer 115 and the first pixel electrode 321. Among them, the first pixel electrode 321 may be electrically connected to the drain 221 via a metal via hole, the first pixel electrode 321 can be an anode, the anode can be made of indium tin oxide (ITO), indium zinc oxide (IZO), zinc oxide (ZnO) and other materials. The pixel definition portion 117 may cover the planarization portion, and the pixel definition portion 117 may be made of organic materials, such as: photoresist, and other organic materials, and a part of the pixel definition portion 117 located in the active area 70 may be provided with a pixel opening exposing the first pixel electrode 321. The light-emitting portion 322 is located within the pixel opening and formed on the first pixel electrode 321, a material of the light-emitting portion 322 may include small molecule organic materials or polymer molecular organic materials, may be fluorescent luminescent materials or phosphorescent luminescent materials, and may emit red light, green light, blue light, or may emit white light, and so on. Moreover, according to the actual different needs, in different examples, the light-emitting part 322 may further include an electron injection layer, an electron transport layer, a hole injection layer, a hole transport layer and other functional layers. The second pixel electrode 323 covers the light-emitting portion 322, and the polarity of the second pixel electrode 323 is opposite to that of the first pixel electrode 321. The second pixel electrode 323 can be a cathode, the cathode can be made of lithium (Li), aluminum (Al), magnesium (Mg), silver (Ag) and other metal materials.

It should be noted that, as shown in FIG. 15, the first pixel electrode 321, the light-emitting portion 322 and the second pixel electrode 323 can form a light-emitting sub-pixel. A portion of the display device located in the active area 70 may include a plurality of light-emitting sub-pixels arranged in array. In addition, it should also be noted that the first pixel electrodes 321 of various luminescent sub-pixels are independent from each other, and the second pixel electrodes 323 of various light-emitting sub-pixels are connected with a whole surface. That is, the second pixel electrode 323 is a whole surface structure disposed on the display panel, which is a common electrode for a plurality of display devices.

In one feasible embodiment, as shown in FIG. 15, one side of the pixel delimitation portion 117 away from the interlayer dielectric layer 115 may also be provided with a support portion 118, the support portion 118 may play the role of supporting the protective film (not shown in the drawing) to avoid the case that the first pixel electrode 321 or other wiring is easily damaged due to the contact between the protective film and the first pixel electrode 321 or other wiring. It should be noted that, the protective film mainly appears in the transfer process of semi-finished products, to avoid the damage of the semi-finished products during the transfer process, specifically: in the process of transferring the substrate of the fabricated support portion 118 to the evaporation production line, the substrate can be covered by a protective film, and when the evaporation of luminescent materials is required, the protective film is removed.

For example, the material of the support portion 118 may be the same as the material of the pixel definition portion 117, and the support portion 118 and the pixel definition portion 117 may be formed by the same composition process, but not limited to this. The material of the support portion 118 may also be different from the material of the pixel definition portion 117, and the support portion 118 and the pixel definition portion 117 may also be formed using different composition processes.

Figure 16:
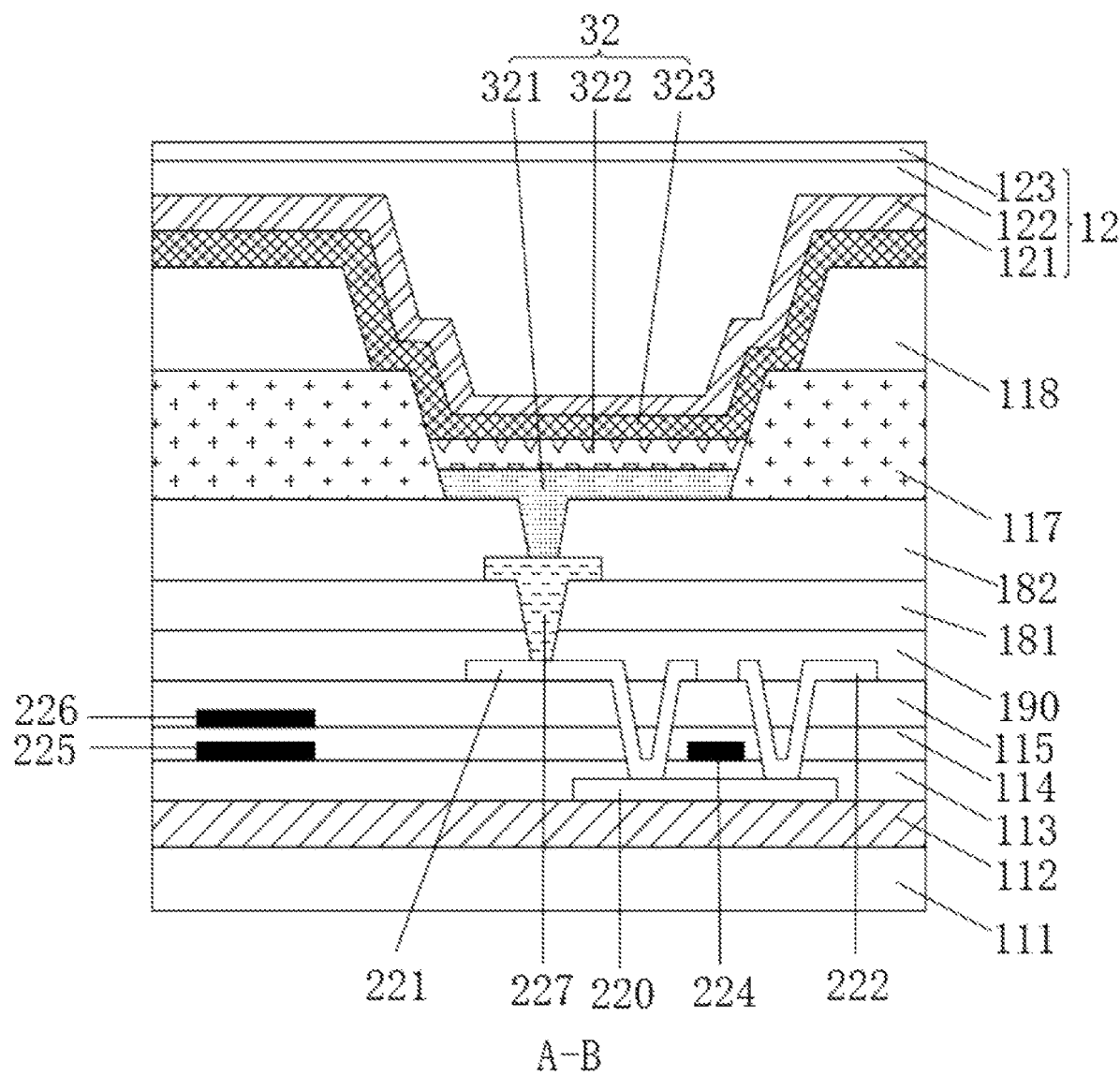
FIG. 16 illustrates a cross-sectional schematic diagram of another display panel in the A-B direction according to an embodiment of the present disclosure.

In one feasible embodiment, as shown in FIG. 16, the first pixel electrode 321 may also be electrically connected with the drain 221 by the first adapter electrode 227. When the first pixel electrode 321 is electrically connected with the drain 221 by the first adapter electrode 227, the planarization portion may be a double-layer structure, which may include a first planarization film (PLN1) layer 181 and a second planarization film (PLN2) layer 182 formed sequentially. In addition, a first passivation film (PVX) layer 190 may also be formed between the first planarization film 181 and the interlayer dielectric layer 115, the passivation film 190 can be formed by materials such as silicon oxide, silicon nitride or silicon oxynitride: the first passivation film 190 covers the source 222 and the drain 221. It should be noted that when the planarization portion is a single layer, a passivation film can also be formed between the planarization portion and the interlayer dielectric layer 115. The first adapter electrode 227 is formed between the first planarization film 181 and the second planarization film 182, and is electrically connected with the drain 221 through the via holes (e.g., metal via holes) of the first planarization film 181 and the first passivation film 190 in turn. The first pixel electrode 321 may be electrically connected to the first adapter electrode 227 through a via hole (e.g., a metal via hole) of the second planarization film 182, as shown in FIG. 16. But not limited to this, the first adapter electrode 227 may also be formed between the first planarization film 181 and the first passivation film 190.

Figure 17:
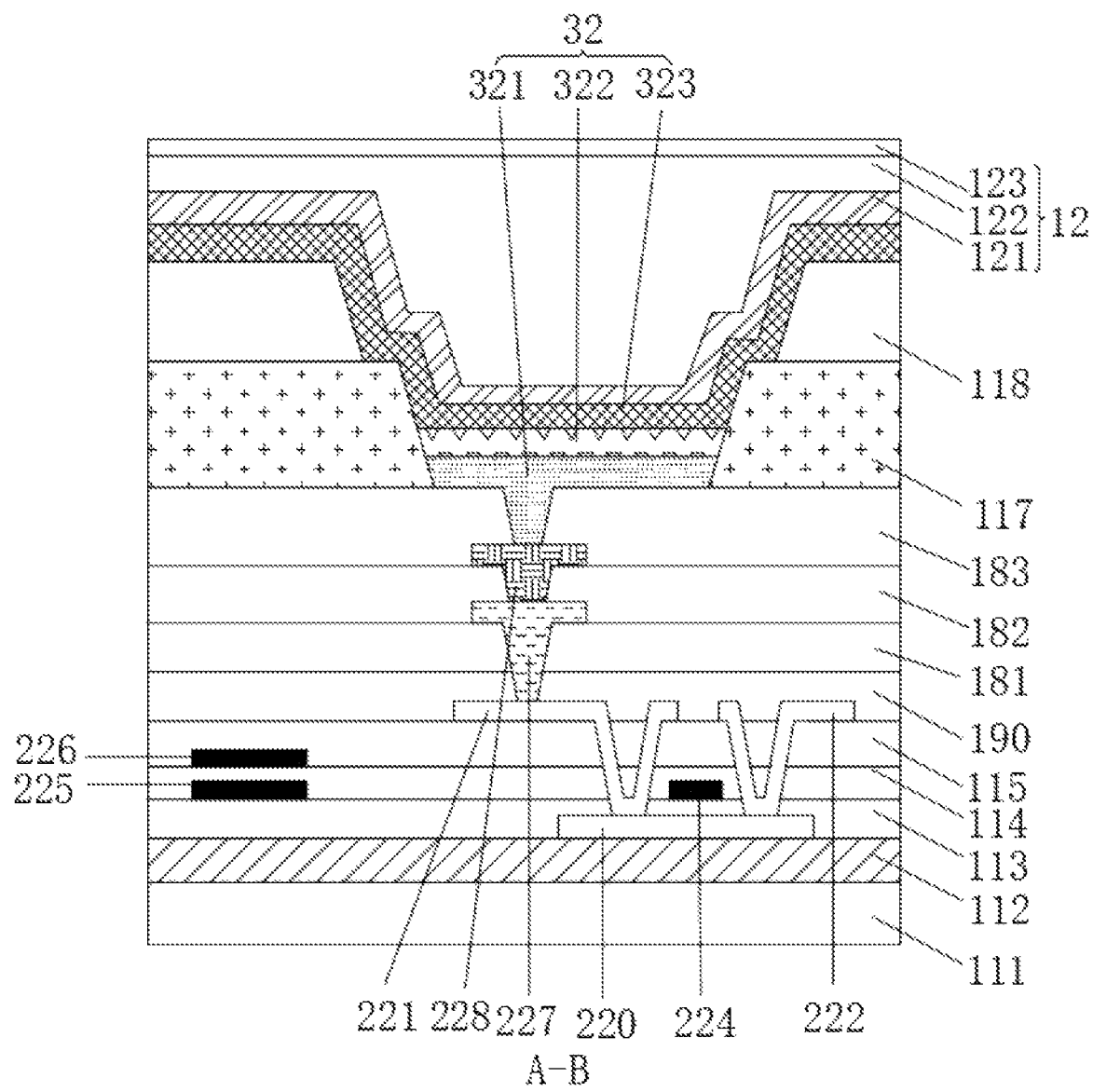
FIG. 17 illustrates a cross-sectional schematic diagram of yet another display panel in the A-B direction according to an embodiment of the present disclosure.

In one feasible embodiment, as shown in FIG. 17, the driving circuit layer further includes a second adapter electrode 228, the first pixel electrode 321 may be electrically connected to the drain 221 through the second adapter electrode 228 and the first adapter electrode 227. When the first pixel electrode 321 may be electrically connected to the drain 221 through the second adapter electrode 228 and the first adapter electrode 227, as described above, the planarization portion not only includes a first planarization film 181 and a second planarization film 182 formed sequentially, but also includes a third planarization film 183, the third planarization film 183 is formed on the side of the second planarization film 182 away from the first planarization film 181. In addition, a second passivation film may also be formed between the third planarization film 183 and the second planarization film 182 (not shown in the drawing). The second adapter electrode 228 is formed between the third planarization film 183 and the second planarization film 182, and is electrically connected to the first adapter electrode 227 through a via hole of the second planarization film 182. While the first adapter electrode is electrically connected with the drain 221 sequentially through the via holes of the first planarization film 181 and the first passivation film 190 (e.g., metal via holes), the first pixel electrode 321 may be electrically connected with the second adapter electrode 228 through the via holes of the third planarization film 183 and the second passivation film, and the second adapter electrode 228 may also be formed between the second planarization film 182 and the second passivation film.

Figure 18:
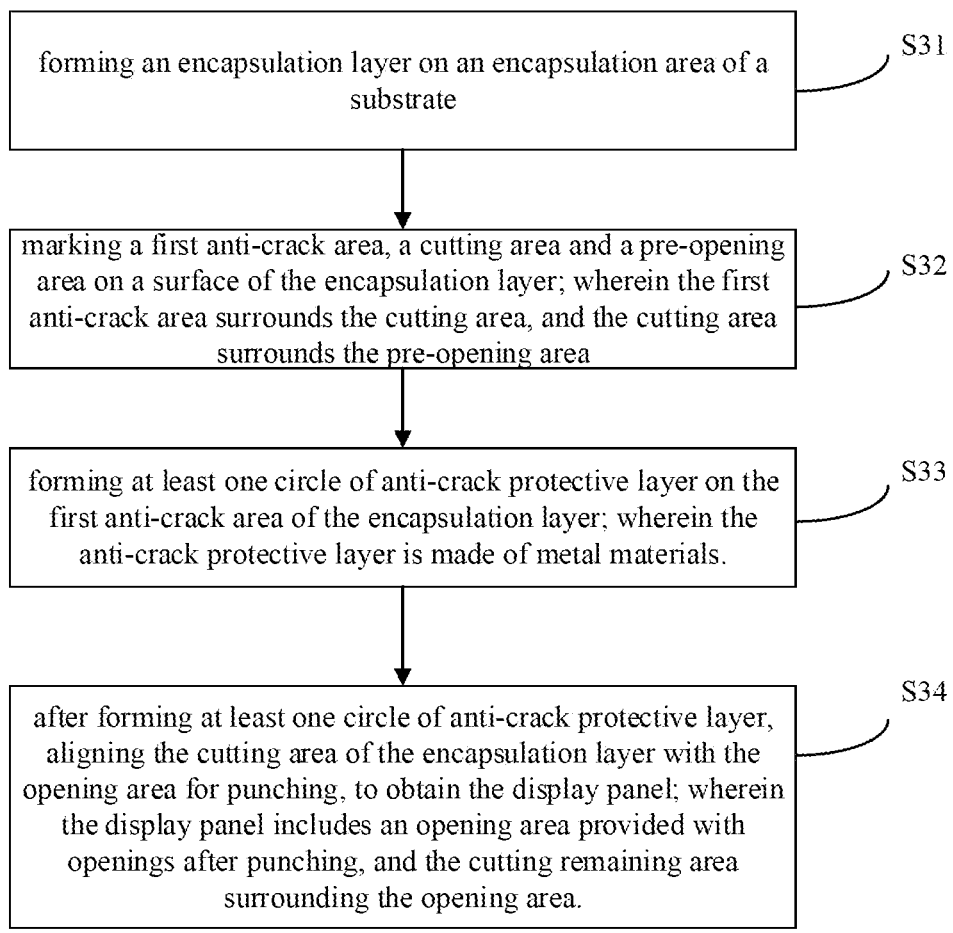
FIG. 18 illustrates a step flow chart of a preparation method of a display panel according to an embodiment of the present disclosure.

Referring to FIG. 18, FIG. 18 is a step flow chart of a preparation method of a display panel provided by the embodiment of the present disclosure. As shown in FIG. 18, the embodiment of the present disclosure also provides a preparation method of a display panel, the method including:

S31, forming an encapsulation layer 12 on an encapsulation area of a substrate 11.

In the embodiment of the present disclosure, the preparation method of the encapsulation layer 12 belongs to the prior art, the active area, the electronic components and films between the substrate 11 and the encapsulation layer 12 in the touch area, including luminescent layers, can be prepared by the prior art, which will not be repeated here.

S32, marking a first anti-crack area 40, a cutting area and a pre-opening area on a surface of the encapsulation layer 12. Wherein the first anti-crack area 40 surrounds the cutting area, and the cutting area surrounds the pre-opening area.

Specifically, the structure obtained in the preceding step can be aligned and grasped by the charge-coupled device (CCD) visual inspection technology, and then the surface of the encapsulation layer 12 of the structure is marked with a preset image of the processing area. Among them, the preset image of the processing area includes at least a preset image of the first anti-crack area 40, a preset image of the cutting area, and a preset image of the opening area.

Thereinto, the cutting area at least contains the left cutting remaining area 30 after cutting and punching. The center position of the opening area corresponds to the center position of the opening area 20 obtained after cutting and punching.

S33, forming at least one circle of anti-crack protective layer 41 on the first anti-crack area 40 of the encapsulation layer 12. Among them, the anti-crack protective layer 41 is made of metal materials.

Specifically, the preparation of the anti-crack protective layer 41 can use existing FMLOC technology, which will not be repeated here.

S34, after forming at least one circle of anti-crack protective layer 41, aligning the cutting area of the encapsulation layer 12 with the opening area for punching, to obtain the display panel. Wherein the display panel includes an opening area 20 provided with openings 21 after punching, and the cutting remaining area 30 surrounding the opening area 20.

Among them, the perforation cutting method of the display panel also belongs to the prior art, for example, the perforation can use laser cutting, so the specific practice will not be repeated.

In order to improve the effect of blocking the cracks of the opening 21 of the peripheral area of the opening area 20 of the prepared display panel, as well, improve the effect of blocking the cracks of the opening 21 during the opening cutting process of the preparation of the display panel. In an optional embodiment, the present disclosure also provides a preparation method of at least one circle of a double-layer anti-crack protective layer 41, including:

S41, forming at least one circle of first anti-crack protective layer 401 on the first anti-crack area 40 of the encapsulation layer 12.

Figure 19:
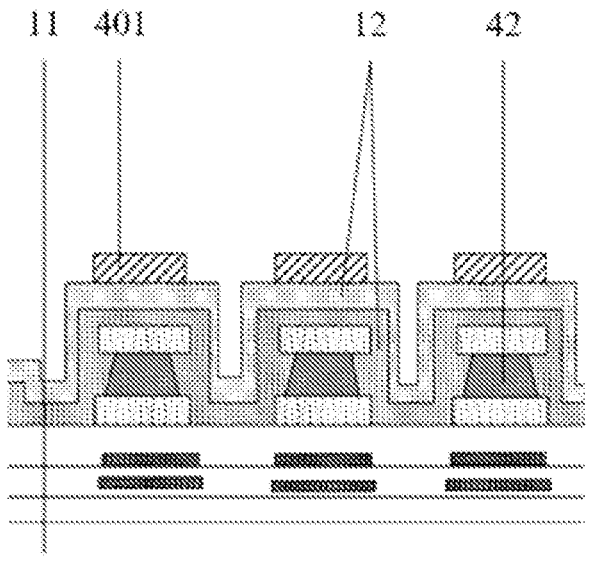
FIG. 19 illustrates a schematic diagram of forming a first anti-crack protective layer according to an embodiment of the present disclosure.

Referring to FIG. 19, FIG. 19 is a schematic diagram of forming the first anti-crack protective layer provided by the embodiment of the present disclosure. As shown in FIG. 19, at least one circle of first anti-crack protective layer 401 may be prepared in a position area directly above the first anti-crack dam 42 of the first anti-crack area 40 on the encapsulation layer 12 and/or an area corresponding to the gap formed by two adjacent circles of first anti-crack dams 42 by mask deposition or etching.

S42, preparing a touch insulation layer 402 on each circle of first anti-crack protective layer 401 of at least one circle of first anti-crack protective layer 401, to obtain at least one circle of touch insulation layer 402.

Figure 20:
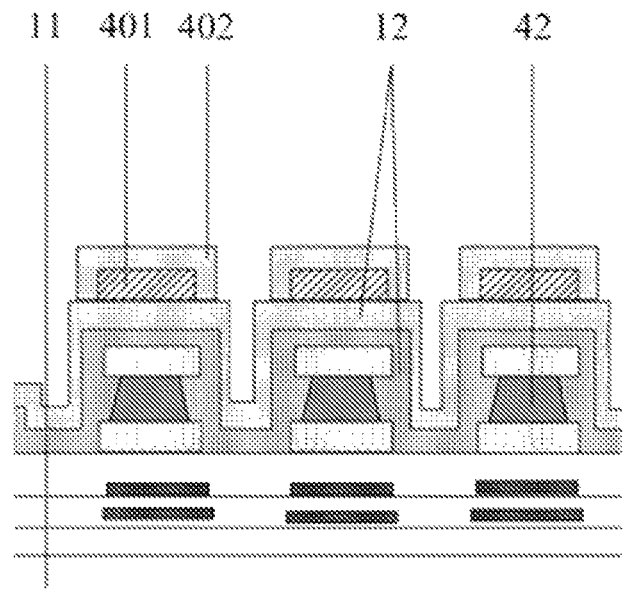
FIG. 20 illustrates a schematic diagram of forming a touch insulation layer according to an embodiment of the present disclosure.

Referring to FIG. 20, FIG. 20 is a schematic diagram of forming the touch insulation layer provided by the embodiment of the present disclosure. As shown in FIG. 20, when the preceding step is to prepare the first anti-crack protective layer 401 in the position area directly above multi-turn first anti-crack dams 42 of the first anti-crack area 40 on the encapsulation layer 12, the touch insulation layer 402 also corresponds to the position area directly above the first anti-crack dam 42 of the first anti-crack protective layer 401, in this case, the touch insulation layer 402 may also be prepared on the side surface of each circle of first anti-crack protective layer 401, so that each circle of prepared touch insulation layer 402 wraps the first touch anti-crack layer 401 of this circle.

Among them, the material of the anti-crack protective layer 41 may be the same or similar as the material of the encapsulation layer 12, the preparation method of the anti-crack protective layer 41 may also be the same as the encapsulation layer 12 using vapor deposition masking. Wherein the touch insulation layer 402 may also be prepared through the mask, so that at least one circle of touch insulation layer 402 is provided with an opening penetrating the first anti-crack protective layer 401 and the second anti-crack protective layer 403 of this circle. The method may perform the mask processing on a preset hole corresponding to the opening penetrating the first anti-crack protective layer 401 and the second anti-crack protective layer 403, to obtain the opening penetrating the first anti-crack protective layer 401 and the second anti-crack protective layer 403. The specific preparation process may use the prior art, which will be not repeated here.

S43, preparing a second anti-crack protective layer 403 on each circle of touch insulation layer 402 of at least one circle of touch insulation layer 402, to obtain at least one circle of second anti-crack protective layer 403.

Referring to FIG. 8 or FIG. 10, the embodiment of the present disclosure obtains each circle of first anti-crack protective layer 401, touch insulation layer 402, and second anti-crack protective layer 403, to form the anti-crack protective layer 41 of this circle.

Among them, each touch metal layer and dielectric layer of the active area corresponding to each layer in the anti-crack protective layer 41 can be used to jointly cooperate and implement the touch function of the display panel in the position area where they are located. While the anti-crack protective layer 41 surrounding the opening 21 can prevent the cracks of the opening 21 of the display panel from spreading to the active area 70, and even the anti-crack protective layer 41 can realize the touch function of the peripheral area of the opening 21.

By the preparation method of the display panel provided by the above embodiments, it is realized to prepare a single layer or double layer of anti-crack protective layer 41 with metal materials on the first anti-crack area 40 around the cutting area of the opening 21 of the display panel, to use the obtained anti-crack protective layer 41 to increase the anti-crack ability of the active area around the opening 21 of the display panel, and, and the touch function of the peripheral area of the opening may also be realized without adding additional touch unit components.

In the process of preparing the display panel, an organic luminescent layer is also provided between the encapsulation layer 12 and the first anti-crack dam 42. The first anti-crack dam 42 is usually a titanium-aluminum-titanium (Ti—Al—Ti) film, considering that materials of the organic luminescent layer have good climbing characteristics, the aluminum layer in the titanium-aluminum-titanium (Ti—

Al—Ti) film is usually etched inward, so that the titanium layer of the top layer and the aluminum layer in the middle form an internally trapped structure, and the titanium layer of the unetched top layer forms a certain length of brim, thereby blocking the climbing material of the organic luminescent layer. However, due to the excellent climbing performance of the organic luminescent material layer, there is a risk of forming water and oxygen intrusion channels.

Figure 21:
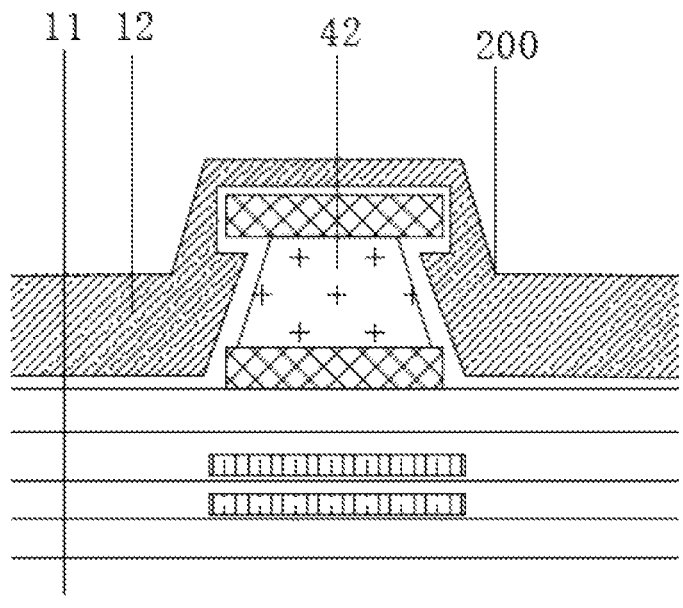
FIG. 21 illustrates a schematic structural diagram of an encapsulation layer with a concave structure according to an embodiment of the present disclosure.

And, as shown in FIG. 21, when depositing the encapsulation layer 12, it is limited by its own film-forming characteristics, after the material of the encapsulation layer 12 climbs, the film-forming rate at an inner side is small, and the film-forming rate at an outer side is large, which eventually leads to that at least one concave structure 200 is formed at a surface of one side of the encapsulation layer 12 away from the first anti-crack dam 42, specifically, the concave structure 200 is located on both sides of the titanium layer on the top layer, and the location where the concave structure 200 on the encapsulation layer 12 is located is prone to cracks, the creation of cracks leads to stress concentration at the location, resulting in a reliability risk at the location.

In order to eliminate the risk of forming a water-oxygen intrusion channel by the organic luminescent material layer and eliminate the reliability risk caused by eliminating cracks, the embodiment of the present disclosure provides another display panel, as shown in FIG. 3, the display panel includes the opening area 20, the active area 70, and the first anti-crack area 40.

Specifically, the active area 70 at least partially surrounds the opening area 20, the first anti-crack area 40 is located between the active area 70 and the opening area 20, and the first anti-crack area 40 at least partially surrounds the opening area 20.

Figure 22:
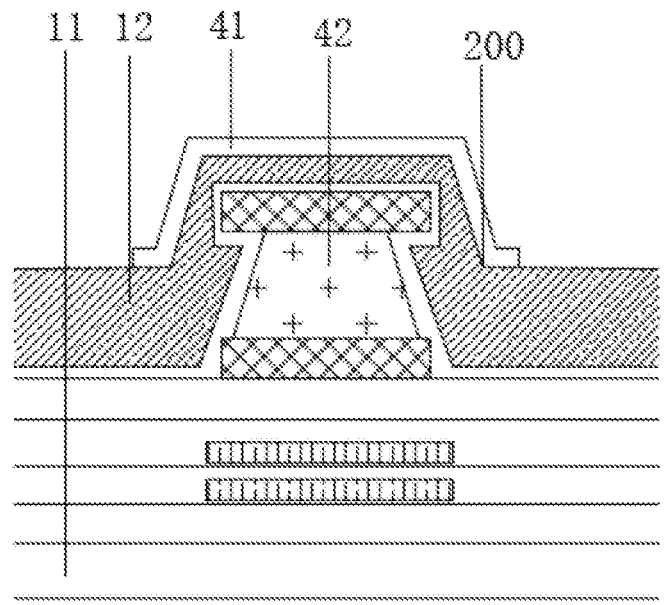
FIG. 22 illustrates a schematic structural diagram of an anti-crack protective layer covering a concave structure of an encapsulation layer according to an embodiment of the present disclosure.

Further, referring to FIG. 22, the display panel in the first anti-crack area 40 further includes: the substrate 11, the encapsulation layer 12 located on the substrate 11, at least one circle of anti-crack protective layer 41 located on the encapsulation layer 12 and at least one circle of first anti-crack dam 42 located under the encapsulation layer 12. An area of the encapsulation layer 12 contacting the at least one circle of first anti-crack dam 42 includes at least one concave structure 200, the anti-crack protective layer 41 covers at least the concave structure 200.

Specifically, the first anti-crack dam 42 includes at least one concave-convex structure, when the first anti-crack dam 42 is a titanium-aluminum-titanium (Ti—Al—Ti) film, if a surface of the titanium layer of the top layer away from the substrate 11 is the top surface, the concave-convex structure of the first anti-crack dam 42 represents a side formed between the titanium layer of the top layer and the aluminum layer of the middle layer depressed towards the inner side of the aluminum layer. When depositing the encapsulation layer 12, due to the film-forming properties of the encapsulation layer 12 itself, the encapsulation layer 12 forms a concave structure 200 at the position of the depressed side. Since the first anti-crack dam has two depressed sides, the encapsulation layer 12 will form two concave structures 200.

Further, the concave structure 200 includes at least one step perpendicular to the direction of the substrate 11, the anti-crack protective layer 41 covers at least the steps. That is, the orthographic projection of the anti-crack protective layer 41 on the substrate 11 and the orthographic projection of the step on the substrate 11 at least partially overlap.

By the embodiment of the present disclosure, the anti-crack protective layer 41 at least partially coven the concave structure 200 at the surface of the encapsulation layer 12. On the one hand, it can completely prevent the water vapor from intruding into the display panel through the water oxygen channels formed by the cracks and the organic luminescent layers. On the other hand, after the anti-crack protective layer 41 covering the concave structure 200 of the encapsulation layer 12 by the metal materials, the problem of stress concentration at the cracks can be effectively improved due to the strong adhesion between the metal layers.

In an optional embodiment, the present disclosure further provides a display panel, in the display panel, the concave structure 200 includes at least two first surfaces and a second surface located between the two first surfaces, and two steps perpendicular to the direction of the substrate connecting the first surfaces and the second surface, and the anti-crack protective layer 41 complete covers of the concave structure 200.

Figure 23:
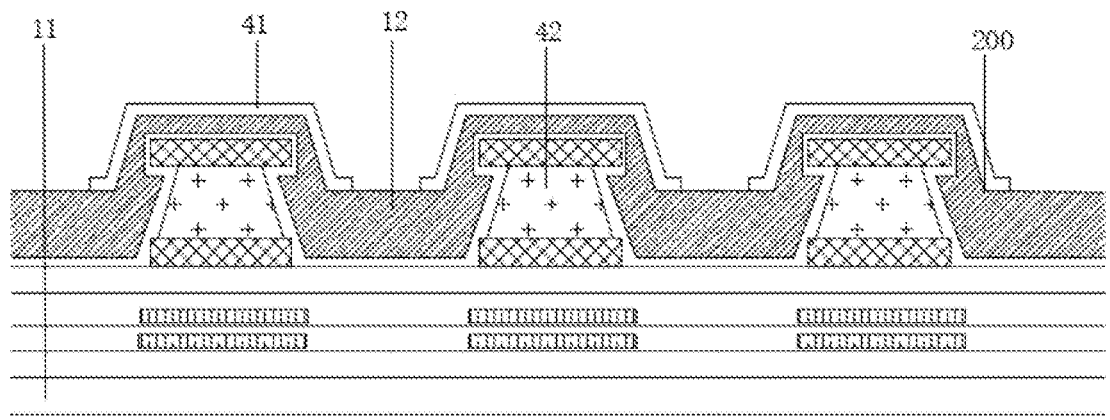
FIG. 23 illustrates a schematic diagram of an anti-crack protective layer distributed in a first mode and covering a concave structure of an encapsulation layer according to an embodiment of the present disclosure.
Figure 24:
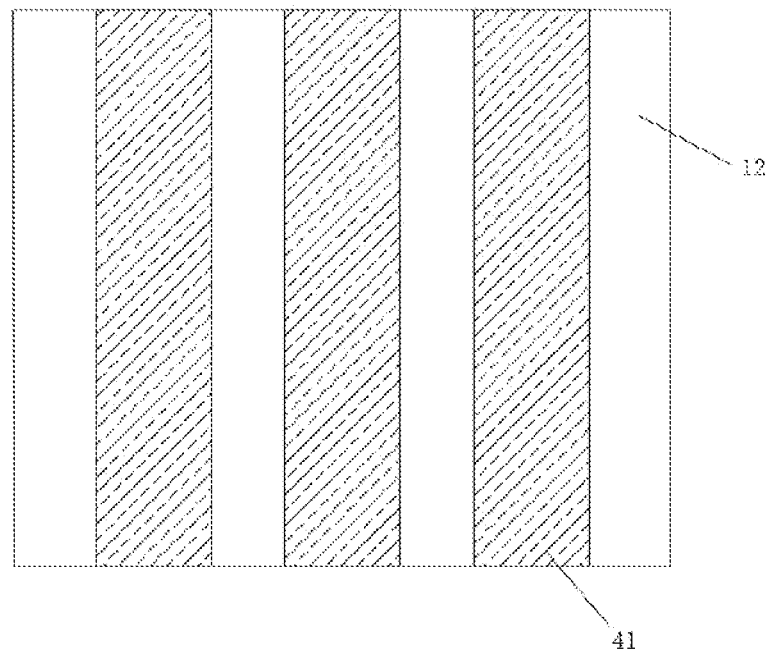
FIG. 24 illustrates a planner schematic diagram of an anti-crack protective layer distributed in the first mode and covering a concave structure of an encapsulation layer according to an embodiment of the present disclosure.

Specifically, after the encapsulation layer 12 covers the first anti-crack dam 42, two planes parallel to substrate 11 will be formed, these two planes are the two first surfaces, and the second surface is a surface between the two first surfaces and inclined with respect to the substrate 11, which connecting the second surface and the two first surfaces is two steps perpendicular to the direction of the substrate 11, thus forming the concave structure formed after the encapsulation layer 12 contacting the first anti-crack dam 42. The anti-crack protective layer 41 completely covers the concave structure 200, i.e., the anti-crack protective layer 41 completely covers the two first surfaces and the second surface, and as shown in FIG. 23 and FIG. 24, the orthographic projection of the anti-crack protective layer 41 on the substrate 11 completely covers the orthographic projection of the concave structure 200 on the substrate 11.

By the embodiment of the present disclosure, the anti-crack protective layer 41 completely covers the concave structure 200 at the surface of the encapsulation layer 12, which will better prevent the water vapor from intruding into the display panel through the water oxygen channels formed by the cracks and the organic luminescent layers and improve the stress concentration at the concave structure, thereby increasing the lifespan of the display panel.

As shown in FIG. 22, a side surface of the anti-crack protective layer 41 is disposed obliquely relative to the plane direction of the substrate 11, the tilt angle between the side surface and the plane direction of the substrate 11 may be 20°-40°, e.g., 20°, 25°, 30°, 40°, and so on.

In order to ensure that the anti-crack protective layer 41 can fully cover the concave structure 200, in an optional embodiment, the present disclosure also provides a display panel, in the display panel, the orthographic projection of the anti-crack protective layer 41 on the substrate 11 covers the orthographic projection of the first anti-crack dam 42 on the substrate 11. And the minimum distance between a boundary of the orthographic projection of the anti-crack protective layer 41 on the substrate 11 and a boundary of the orthographic projection of the first anti-crack dam 42 on the substrate 11 is greater than or equal to 0.4 μm, and less than or equal to 0.5 μm, to ensure that the anti-crack protective layer 41 can fully cover the concave structure 200 of the encapsulation layer 12.

Also, as mentioned above, the anti-crack protective layer 41 and the first touch metal layer 701 of the touch electrode layer 71 may be disposed in the same layer and with the same materials, or, the anti-crack protective layer 41 and the second touch metal layer 702 of the touch electrode layer 71 may be disposed in the same layer and with the same materials. That is, in the process of preparing the display panel, the anti-crack protective layer 41 may be formed synchronously with the first touch metal layer 701, may also be formed synchronously with the second touch metal layer 702, the material and thickness of the anti-crack protective layer 41 may be the same as that of the first touch metal layer 701 or the second touch metal layer 702.

Specifically, when forming the anti-crack protection layer 41, only the mask of the first touch metal layer 701 or the second touch metal layer 702 located in the first anti-crack area 40 needs to be changed, and the alignment accuracy between the first anti-crack dam 42 and the first touch metal layer 701 or the second touch metal layer 702 is strictly controlled. At the same time, it is necessary to control the minimum distance between the boundary of the orthographic projection of the anti-crack protective layer 41 on the substrate 11 and the boundary of the orthographic projection of the first anti-crack dam 42 on the substrate 11.

For example, in an optional embodiment, the present disclosure also provides a display panel, in the display panel, the anti-crack protective layer 41 can be molded synchronously with the first touch metal layer 701, in the process, it is determined that the alignment accuracy between the first anti-crack dam 42 and the first touch metal layer 701 is less than or equal to 0.3, and it is determined that the minimum distance between the boundary of the orthographic projection of the anti-crack protective layer 41 on the substrate 11 and the boundary of the orthographic projection of the first anti-crack dam 42 on the substrate 11 is 0.5 microns.

In an optional embodiment, the present disclosure also provides a display panel, in the display panel, the anti-crack protective layer 41 can be molded synchronously with the second touch metal layer 703, in the process, it is determined that the alignment accuracy between the first anti-crack dam 42 and the second touch metal layer 703 is less than or equal to 0.3, and it is determined that the minimum distance between the boundary of the orthographic projection of the anti-crack protective layer 41 on the substrate 11 and the boundary of the orthographic projection of the first anti-crack dam 42 on the substrate 11 is 0.5 microns.

In an optional embodiment, the present disclosure also provides a display panel, in the display panel, the anti-crack protective layer 41 can be molded synchronously with the first touch metal layer 701, in the process, it is determined that the alignment accuracy between the first anti-crack dam 42 and the first touch metal layer 701 is less than or equal to 0.2, and it is determined that the minimum distance between the boundary of the orthographic projection of the anti-crack protective layer 41 on the substrate 11 and the boundary of the orthographic projection of the first anti-crack dam 42 on the substrate 11 is 0.4 microns.

In an optional embodiment, the present disclosure also provides a display panel, in the display panel, the anti-crack protective layer 41 can be molded synchronously with the second touch metal layer 703, in the process, it is determined that the alignment accuracy between the first anti-crack dam 42 and the second touch metal layer 703 is less than or equal to 0.2, and it is determined that the minimum distance between the boundary of the orthographic projection of the anti-crack protective layer 41 on the substrate 11 and the boundary of the orthographic projection of the first anti-crack dam 42 on the substrate 11 is 0.4 microns.

Referring to FIG. 23 and FIG. 24, in an optional embodiment, the present disclosure further provides a display panel, in the display panel, the first anti-crack dam 42 and the anti-crack protective layer 41 are stacked on both sides of the encapsulation layer 12, the orthographic projection of the first anti-crack dam 42 on the substrate 11 at least partially covers the orthographic projection of the anti-crack protective layer 41 on the substrate 11.

Further, referring to FIG. 23 and FIG. 24, the orthographic projection of the first anti-crack dam 42 on the substrate 11 may completely cover the orthographic projection of the anti-crack protective layer 41 on the substrate 11, and, the center position of the orthographic projection of the first anti-crack dam 42 on the substrate 11 may be coincide with the center position of the orthographic projection of the anti-crack protective layer 41 on the substrate 11. And, in the embodiment of the present disclosure, two sides of the anti-crack protective layer 41 extend towards the concave structure 200 of the encapsulation layer 12, to make the anti-crack protective layer 41 prevent the water vapor from intruding into the display panel through the water oxygen channels formed by the cracks and the organic luminescent layers and improve the stress concentration at the concave structure.

Figure 25:
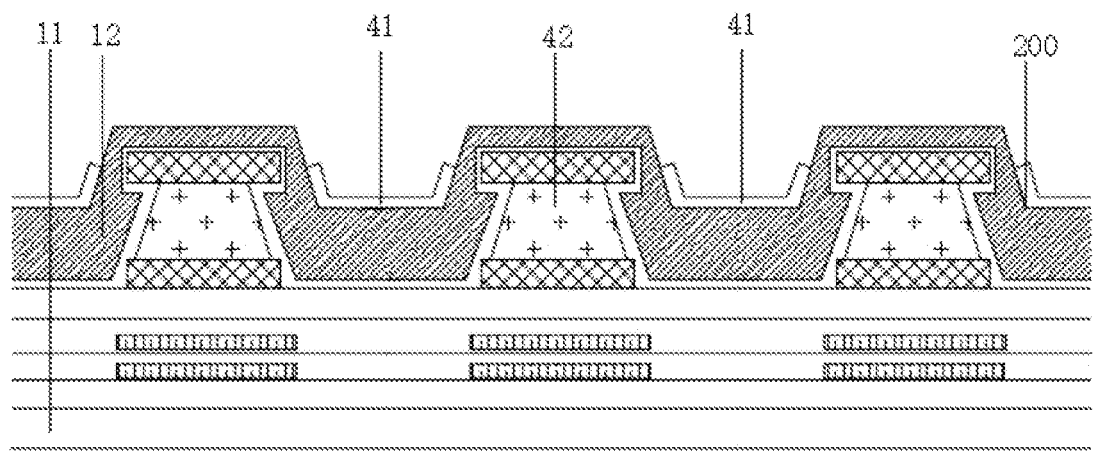
FIG. 25 illustrates a schematic diagram of an anti-crack protective layer distributed in a second mode and covering a concave structure of an encapsulation layer according to an embodiment of the present disclosure.
Figure 26:
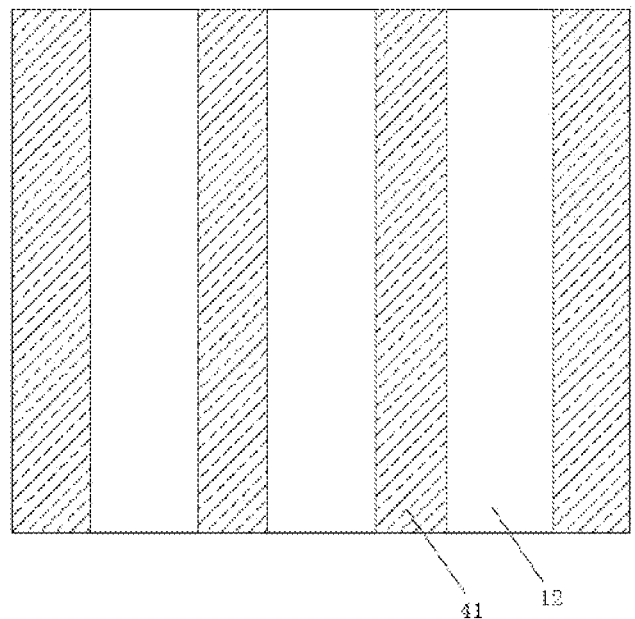
FIG. 26 illustrates a planner schematic diagram of an anti-crack protective layer distributed in the second mode and covering a concave structure of an encapsulation layer according to an embodiment of the present disclosure.

As shown in FIG. 25 and FIG. 26, in an optional embodiment, the present disclosure further provides a display panel, in the display panel, the first anti-crack dam 42 and the anti-crack protective layer 41 are dislocated at two sides of the encapsulation layer 12, the orthographic projection of the anti-crack protective layer 41 on the substrate 11 is located between the orthographic projections of two adjacent first anti-crack dams 42 on the substrate 11, and, the two sides of the anti-crack protective layer 41 extend towards the concave structure 200 on the encapsulation layer 12, so that the anti-crack protective layer 41 covers the concave structure 200, to make the anti-crack protective layer 41 prevent the water vapor from intruding into the display panel through the water oxygen channels formed by the cracks and the organic luminescent layers and improve the stress concentration at the concave structure.

Further, referring to FIG. 25 and FIG. 26, the center position of the orthographic projection of the anti-crack protective layer 41 may be coincide with the center position of the orthographic projection of the gap formed by two adjacent anti-crack dams 42 at on the substrate 11.

Figure 27:
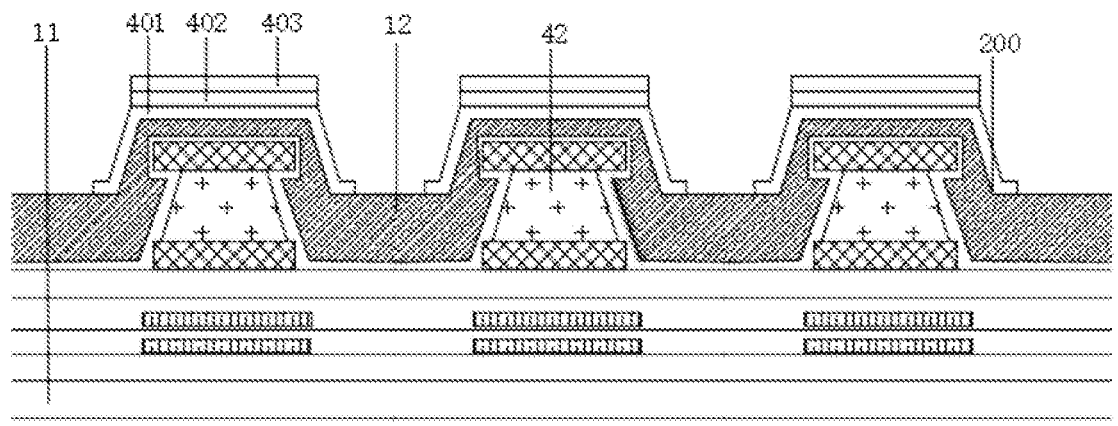
FIG. 27 illustrates a schematic diagram of a multilayer anti-crack protective layer covering a concave structure of an encapsulation layer according to an embodiment of the present disclosure.
Figure 28:
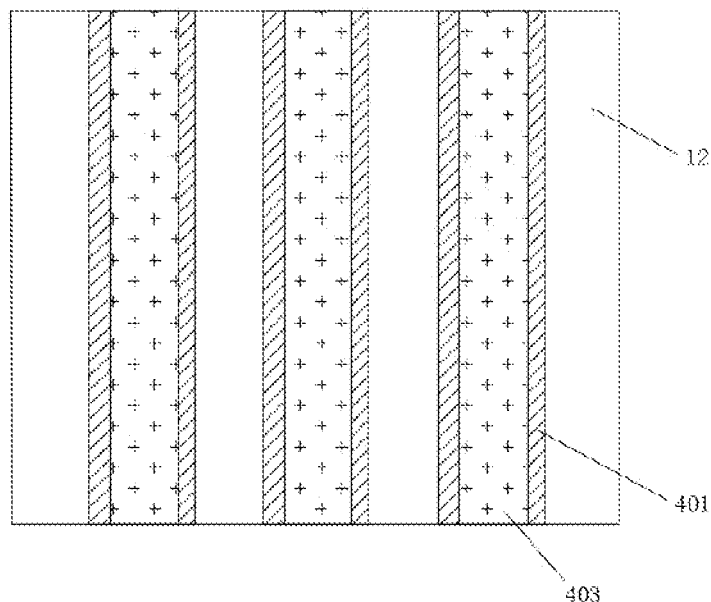
FIG. 28 illustrates a planner schematic diagram of a multilayer anti-crack protective layer covering a concave structure of an encapsulation layer according to an embodiment of the present disclosure.

Referring to FIG. 27 and FIG. 28, in an optional embodiment, the present disclosure further provides a display panel, in the display panel, the anti-crack protective layer 41 includes a first anti-crack protective layer 401 and a second anti-crack protective layer 403 that are stacked and a touch insulation layer 402 between the first anti-crack protective layer 401 and the second anti-crack protective layer 403. In the case that the anti-crack protective layer 41 is double-layered, it is optional to make the first anti-crack protective layer 401 and/or the second anti-crack protective layer 403 cover the concave structure.

Specifically, as shown in FIG. 27 and FIG. 28, when selecting that the first anti-crack protective layer 401 covers the concave structure, only the orthographic projection of the first anti-crack protective layer 401 on the substrate 11 needs to cover the orthographic projection of the concave structure on substrate 11 during the process of preparing the first anti-crack protective layer 401. As for the touch insulation layer 402 and the second anti-crack protective layer 403, which are normally formed on the first anti-crack protective layer 401, and the orthographic projection of the second anti-crack protective layer 403 on the substrate 11 does not extend beyond the orthographic projection of the first anti-crack protective layer 401 on the substrate 11.

Figure 29:
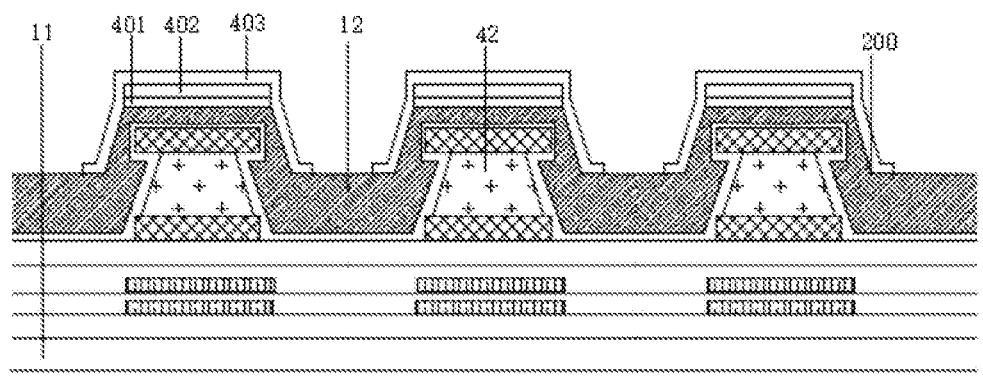
FIG. 29 illustrates a schematic diagram of another multilayer anti-crack protective layer covering a concave structure of an encapsulation layer according to an embodiment of the present disclosure.
Figure 30:
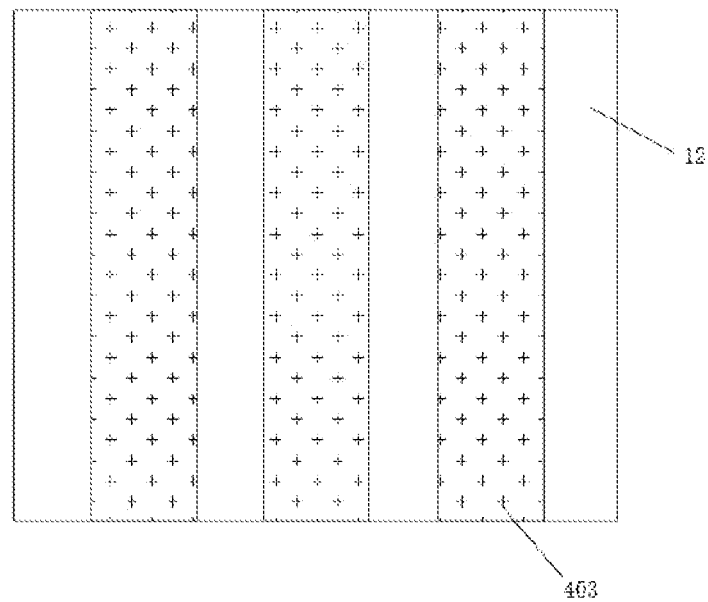
FIG. 30 illustrates a planner schematic diagram of another multilayer anti-crack protective layer covering a concave structure of an encapsulation layer according to an embodiment of the present disclosure.

As shown in FIG. 29 and FIG. 30, when selecting that the second anti-crack protective layer 403 covers the concave structure, after the preparation of the first anti-crack protective layer 401 and the touch insulation layer 402, it is necessary to make the boundary of the second anti-crack protective layer 403 extend, and eventually make the part of the second anti-crack protective layer 403 extending beyond the first anti-crack protective layer 401 cover the concave structure. At this time, the orthographic projection of the second anti-crack protective layer 403 on the substrate 11 goes beyond the orthographic projection of the first anti-crack protective layer 401 on the substrate 11.

Figure 31:
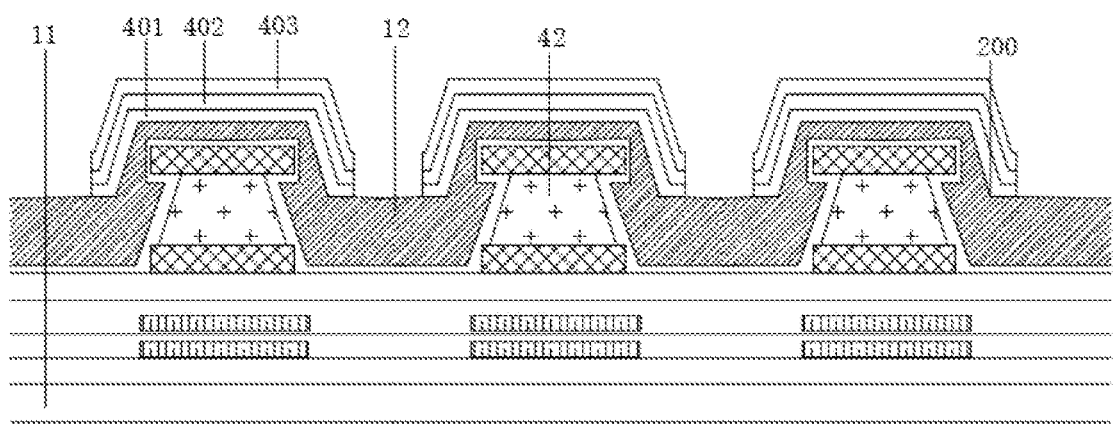
FIG. 31 illustrates a schematic diagram of yet another multilayer anti-crack protective layer covering a concave structure of an encapsulation layer according to an embodiment of the present disclosure.
Figure 32:
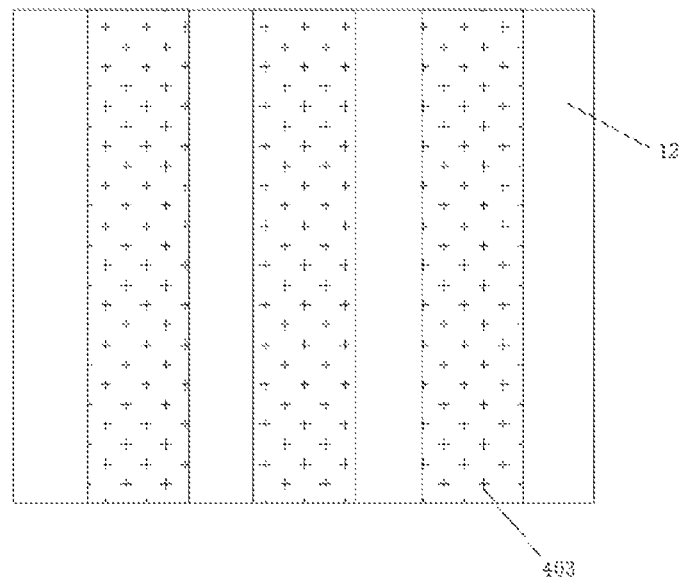
FIG. 32 illustrates a planner schematic diagram of yet another multilayer anti-crack protective layer covering a concave structure of an encapsulation layer according to an embodiment of the present disclosure.

As shown in FIG. 31 and FIG. 32, in a feasible embodiment, the first anti-crack protective layer 401 and the second anti-crack protective layer 403 may cover the concave structure at the same time. Meanwhile, the orthographic projection of the first anti-crack protective layer 401 on the substrate 11 coincides with the orthographic projection of the second anti-crack protective layer 403 on the substrate 11, and completely covers the orthographic projection of the concave structure on the substrate 11.

By the embodiment of the present disclosure, the anti-crack protective layer 41 including the first anti-crack protective layer 401 and the second anti-crack protective layer 403 is disposed, and the first anti-crack protective layer 401 or the second anti-crack protective layer 403 covers the concave structure, which utilizes a dual anti-crack protective layer 41 to improve the ability of the first anti-crack area 40 to prevent the cracks from spreading, and also eliminates the risk of the water and oxygen intrusion channels formed by the organic luminescent material layer and eliminates the reliability risk caused by eliminating the cracks.

The embodiment of the present disclosure also provides a display device, the display device includes a display panel described in any of the above embodiments.

Specifically, the display device may include an organic light-emitting diode (OLED) display, mobile devices such as mobile phones, wearable devices such as watches. VR devices, and so on. Those skilled in the art may choose accordingly according to the specific use of the display device, which will not be repeated herein.

Next, the active area 70 of the display panel and its preparation method will be introduced in combination with the pixel circuit and layout of the active area 70 of the display panel.

Figure 33:
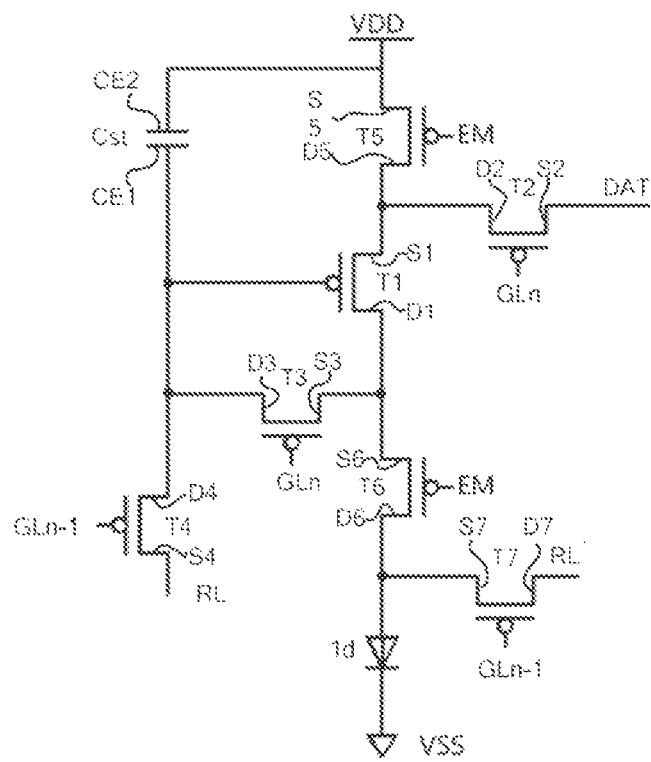
FIG. 33 illustrates an equivalent circuit diagram of a pixel circuit of an active area in a display panel according to an embodiment of the present disclosure.

FIG. 33 is an equivalent circuit diagram of the pixel circuit of the active area of the display panel provided by at least one embodiment of the present disclosure, and FIG. 27 to FIG. 31 show the layout design of each layer of the pixel circuit of the active area of the display panel provided by some embodiments of the present disclosure.

FIG. 33 is an equivalent circuit diagram of the pixel circuit of the display panel provided by at least one embodiment of the present disclosure, and FIG. 34 to FIG. 38 are schematic diagrams of each layer of the pixel circuit of the display panel provided by some embodiments of the present disclosure.

In some embodiments, as shown in FIG. 33, the pixel circuit of the drive circuit layer located in the active area includes a plurality of thin-film transistors T1, T2, T3, T4, T5, T6, and T7, a plurality of signal lines connected to the plurality of thin-film transistors T1, T2, T3, T4, T5, T6, and T7, and a storage capacitor Cst, and the plurality of signal lines include a gate line GL (i.e., the scanning signal line), a light-emitting control line EM, an initialization line RL, a data line DAT and a first power line VDD. The gate line GL may include the first gate line GLn and the second gate line GLn−1, for example, the first gate line GLn can be used to transmit the gate scanning signal, and the second gate line GLn−1 can be used to transmit the reset signal. The light-emitting control line EM can be used to transmit light-emitting control signals. Thus, the pixel circuit is a 7T1C pixel circuit.

It should be noted that, the embodiments of the present disclosures include but are not limited to this, the pixel circuits may also adopt other types of circuit structures, such as a 7T2C structure or a 9T2C structure, etc., the embodiment of the present disclosures are not limited to this.

For example, the first gate lines GLn of the pixel circuits corresponding to various rows of luminous subpixels in the active area 70 located on the left and right sides of the opening area 20 can be electrically connected by the inner ring gate signal line to transmit the gate scanning signal, thereby realizing the compensation effect of the gate scanning signal.

For example, as shown in FIG. 33, the first gate G1 of the first thin-film transistor T1 is electrically connected to the third drain D3 of the third thin-film transistor T3 and the fourth drain D4 of the fourth thin-film transistor T4. The first source S1 of the first thin-film transistor T1 is electrically connected to the second drain D2 of the second thin-film transistor T2 and the fifth drain D5 of the fifth thin-film transistor T5. The first drain D1 of the first thin-film transistor T1 is electrically connected to the third source S3 of the third thin-film transistor T3 and the sixth source S6 of the sixth thin-film transistor T6.

For example, as shown in FIG. 33, the second gate G2 of the second thin-film transistor T2 is configured to be electrically connected to the first gate line GLn to receive the gate scanning signal, the second source S2 of the second thin-film transistor T2 is configured to be electrically connected to the data line DAT to receive the data signal, and the second drain D2 of the second thin-film transistor T2 is electrically connected to the first source S1 of the first thin-film transistor T1.

For example, as shown in FIG. 33, the third gate G3 of the third thin-film transistor T3 is configured to be electrically connected to the first gate line GLn, the third source S3 of the third thin-film transistor T3 is electrically connected to the first drain D1 of the first thin-film transistor T1, and the third drain D3 of the third thin-film transistor T3 is electrically connected to the first gate G1 of the first thin-film transistor T1.

For example, as shown in FIG. 33, the fourth gate G4 of the fourth thin-film transistor T4 is configured to be electrically connected with the second gate line GLn−1 to receive a reset signal, the fourth source S4 of the fourth thin-film transistor T4 is configured to be electrically connected with the initialization line RL to receive the initialization signal, and the fourth drain D4 of the fourth thin-film transistor T4 is electrically connected to the first gate G1 of the first thin-film transistor T1.

For example, as shown in FIG. 33, the fifth gate G5 of the fifth thin-film transistor T5 is configured to be electrically connected with the light-emitting control line EM to receive the light-emitting control signal, the fifth source S5 of the fifth thin-film transistor T5 is configured to be electrically connected with the first power line VDD to receive the first power signal, and the fifth drain D5 of the fifth thin-film transistor T5 is electrically connected to the first source S1 of the first thin-film transistor T1.

For example, as shown in FIG. 33, the sixth gate G6 of the sixth thin-film transistor T6 is configured to be electrically connected with the light-emitting control line EM to receive the light-emitting control signal, the sixth source S6 of the sixth thin-film transistor T6 is electrically connected to the first drain D1 of the first thin-film transistor T1, and the sixth drain D6 of the sixth thin-film transistor T6 is electrically connected to the first display electrode (e.g., the first electrode 112) of the light-emitting sub-pixel.

For example, as shown in FIG. 33, the seventh gate G7 of the seventh thin-film transistor T7 is configured to be electrically connected with the second gate line GLn–1 to receive the reset signal, the seventh source S7 of the seventh thin-film transistor T7 is electrically connected to the first display electrode (e.g., the first electrode 112) of the light-emitting sub-pixel, and the seventh drain D7 of the seventh thin-film transistor T7 is configured to be electrically connected with the initialization line RL to receive the initialization signal. For example, the seventh drain D7 of the seventh thin-film transistor T7 can be electrically connected to the initialization line RL by connecting to the fourth source S4 of the fourth thin-film transistor T4.

For example, as shown in FIG. 33, the storage capacitor Cst includes a first capacitive electrode CE1 (i.e., a first plate 130) and a second capacitive electrode CE2 (i.e., a second plate 131). The second capacitive electrode CE2 is electrically connected to the first power line VDD, and the first capacitive electrode CE1 is electrically connected to the first gate G1 of the first thin-film transistor T1 and the third drain D3 of the third thin-film transistor T3.

For example, as shown in FIG. 33, the second display electrode (e.g., the second electrode 115) of the light-emitting sub-pixel 1d is electrically connected to the second power line VSS.

It should be noted that one of the first power line VDD and the second power line VSS is a power line that provides high voltage, and the other is a power line that provides low voltage. In an embodiment shown in FIG. 33, the first power line VDD provides a constant first voltage, and the first voltage is a positive voltage; the second power line VSS provides a constant second voltage, and the second voltage is negative voltage, and so on. For example, in some examples, the second voltage may be grounded.

It should be noted that the reset signal described above and the initialization signal described above may be the same signal.

It should also be noted that, according to the characteristics of the transistors, the transistors may be divided into N-type transistors and P-type transistors, for clarity, the embodiments of the present disclosure take the transistor as a P-type transistor (e.g., P-type TFT) as an example to elaborate the technical solutions of the present disclosure. That is, in the description of the present disclosure, the first thin-film transistor T1, the second thin-film transistor T2, the third thin-film transistor T3, the fourth thin-film transistor T4, the fifth thin-film transistor T5, the sixth thin-film transistor T6 and the seventh thin-film transistor T7 may be the P-type transistors. However, the transistors of embodiments of the present disclosure are not limited to the P-type transistors, and those skilled in the art may also use the N-type transistors (e.g., N-type TFT) to achieve the functions of one or more transistors in embodiments of the present disclosure as actually needed.

It should be noted that the transistors used in the embodiments of the present disclosure may be thin-film transistors or field-effect transistors or other switching devices with the same characteristics, the thin-film transistors may include oxide semiconductor thin-film transistors, amorphous silicon thin-film transistors or polycrystalline silicon thin-film transistors, and so on. The source and drain of the transistor may be symmetrical structurally, so that the source and drain may be no difference in the physical structure, and the source and drain of all or part of the transistor in the embodiments of the present disclosure are interchangeable as needed.

Figure 34:
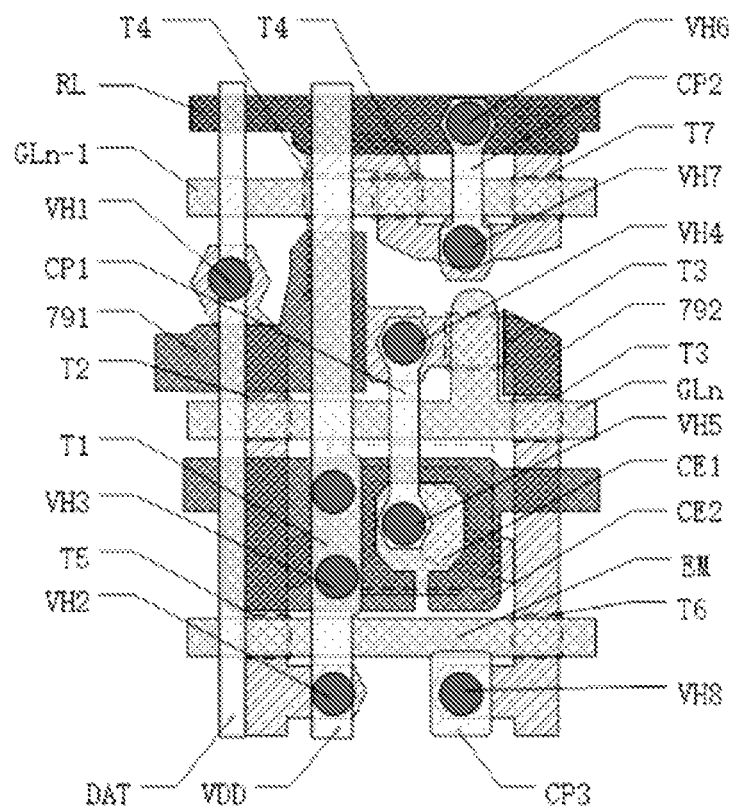
FIG. 34 to FIG. 38 illustrate layout designs of various layers of a pixel circuit of an active area in a display panel according to an embodiment of the present disclosure.

In some embodiments, as shown in FIG. 34, the pixel circuit includes the aforementioned thin-film transistors T1, T2, T3, T4, T5, T6 and T7, the storage capacitor Cst, the first gate line GLn, the second gate line GLn–1, the light-emitting control line EM, the initialization line RL, the data line DAT and the first power line VDD that are connected to the plurality of thin-film transistors T1, T2, T3, T4, T5, T6 and T7. The structure of the pixel circuit is illustrated below in conjunction with FIG. 33 and FIG. 34 to FIG. 38.

For example, FIG. 34 shows a schematic diagram of the stacking position relationship between the semiconductor layer, the first conductive layer, the second conductive layer, and the third conductive layer of the pixel circuit.

Figure 35:
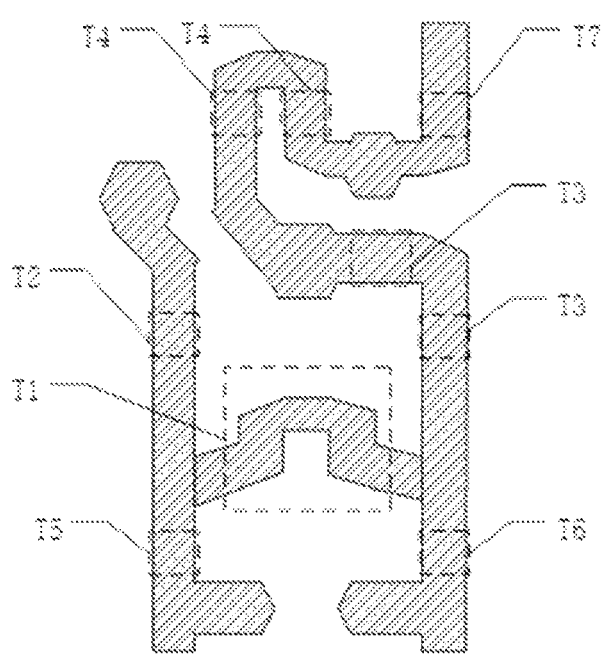

FIG. 35 shows the semiconductor layer of the pixel circuit. For example, the semiconductor layer shown in FIG. 35 includes an active layer 220 shown in FIG. 15. FIG. 16 and FIG. 17, the active layer 220, for example, is the active layer of the sixth thin-film transistor T6. As shown in FIG. 35, the semiconductor layer can be formed by the composition process using the semiconductor material layer. The semiconductor layer may be used to fabricate the active layers of the first thin-film transistor T1, the second thin-film transistor T2, the third thin-film transistor T3, the fourth thin-film transistor T4, the fifth thin-film transistor T5, the sixth thin-film transistor T6 and the seventh thin-film transistor T7, each active layer may include a source area, a drain area, and a channel area between the source area and the drain area. For example, the semiconductor layers can be made of amorphous silicon, polysilicon, oxide semiconductor materials, and so on. It should be noted that the source area and the drain area described above may be areas doped with n-type impurities or p-type impurities.

In the display panel provided by some embodiments of the present disclosure, an insulation layer is formed on the semiconductor layer described above, the insulation layer includes a first gate insulation layer 113 shown in FIG. 15, FIG. 16 and FIG. 17, not shown in FIG. 34 to FIG. 38.

Figure 36:
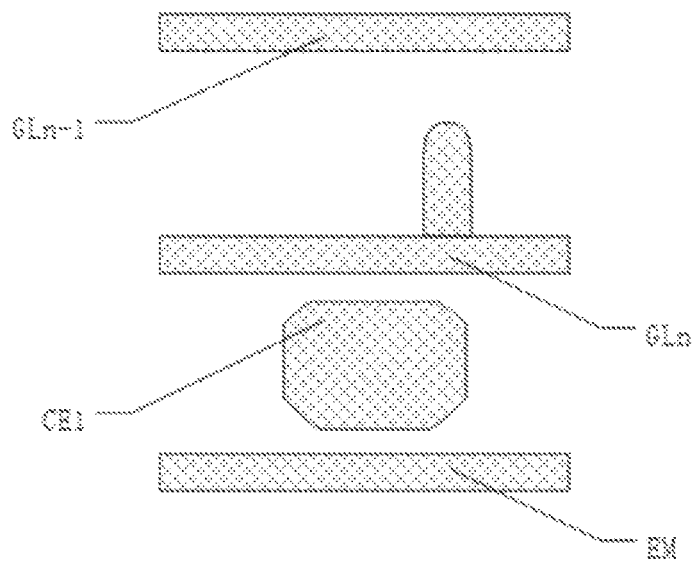

FIG. 36 shows the first conductive layer of the pixel circuit. For example, as shown in FIG. 36, the first conductive layer of the pixel circuit is disposed on the above insulation layer, thereby insulating from the semiconductor layer shown in FIG. 35. The first conductive layer may include the first capacitive electrode CE1 (equivalent to the first plate 225) of the storage capacitance Cst, the first gate line GLn, the second gate line GLn–1, the light-emitting control line EM, and the gates of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 (e.g., the first gate GL, the second gate G2, the third gate G3, the fourth gate G4, the fifth gate G5, the sixth gate G6 and the seventh gate G7). As shown in FIG. 36, the gates of the second thin-film transistor T2, the fourth thin-film transistor T4, the fifth thin-film transistor T5, the sixth thin-film transistor T6 and the seventh thin-film transistor T7 are the first gate line GLn, second gate line GLn–1, the overlapping part of the light-emitting control line EM and the semiconductor layer, and the third thin-film transistor T3 can be a thin-film transistor with a double-gate structure. One gate of the third thin-film transistor T3 may be the part of the first gate line GLn overlapping the semiconductor layer, and the other gate of the third thin-film transistor T3 may be a protrusion protruding from the first gate line GLn; the gate of the first thin-film transistor T1 may be the first capacitive electrode CE1. The fourth thin-film transistor T4 can be a thin-film transistor with a double-gate structure, and the two gates are the part of the second gate line GLn−1 overlapping the semiconductor layer.

In the display panel provided by some embodiments of the present disclosure, another insulation layer is formed on the first conductive layer described above, the insulation layer includes a second gate insulation layer 114 shown in FIG. 15, FIG. 16 and FIG. 17, not shown in FIG. 27 to FIG. 31.

Figure 37:
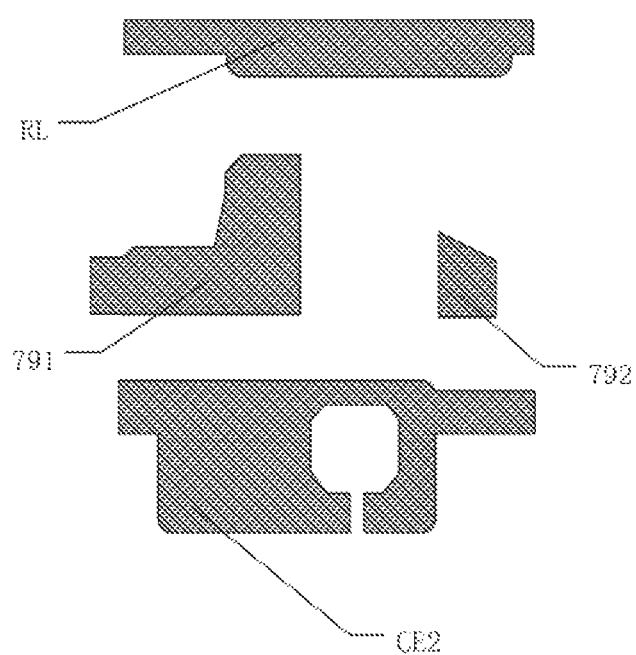

FIG. 37 shows the second conductive layer of the pixel circuit. For example, as shown in FIG. 37, the second conductive layer of the pixel circuit includes a second capacitive electrode CE2 (i.e., the second plate 226) of the storage capacitor Cst and the initialization line RL. The second capacitive electrode CE2 at least partially overlaps the first capacitive electrode CE1 to form the storage capacitor Cst.

For example, the second capacitive electrode CE2 illustrated in FIG. 37 has a notch, and in some embodiments, the second capacitive electrode CE2 may also not have the notch. Embodiments of the present disclosure do not limit the specific structure of the second capacitive electrode CE2.

In some embodiments, the second conductive layer may also include a first shading portion 791 and a second shading portion 792. The orthographic projection of the first shading portion 791 on the substrate covers the active layer of the second thin-film transistor T2, and the active layer between the drain of the third thin-film transistor T3 and the drain of the fourth thin-film transistor T4, thereby preventing the influence of external light on the active layers of the second thin-film transistor T2, the third thin-film transistor T3 and the fourth thin-film transistor T4. The orthographic projection of the second shading portion 792 on the substrate covers the active layer between the two gates of the third thin-film transistor T3, thereby preventing external light from affecting the active layer of the third thin-film transistor T3. The first shading portion 791 may be integrated with the second shading portion 792 of the adjacent pixel circuit, and may be electrically connected to the first power line VDD through a via hole penetrating the insulation layer.

In the display panel provided by some embodiments of the present disclosure, another insulating layer is formed on the second conductive layer described above, the insulation layer includes the interlayer dielectric layer 115 as shown in FIG. 15, FIG. 16 and FIG. 17, not shown in FIG. 34 to FIG. 38.

Figure 38:
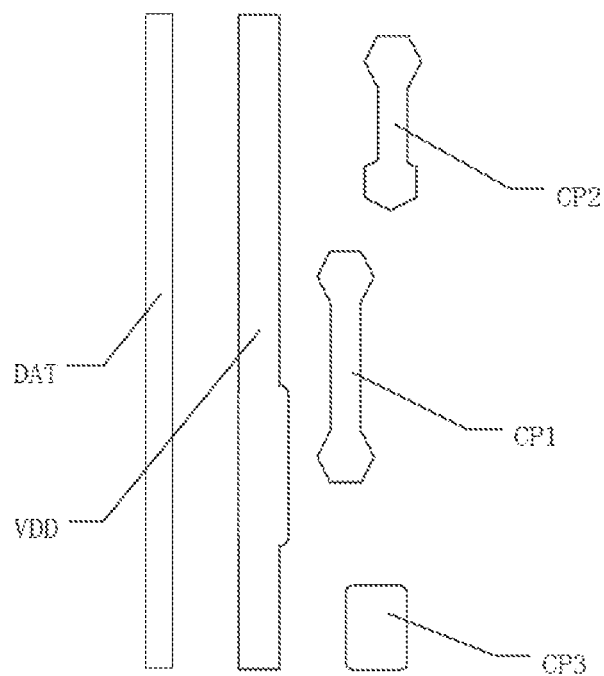

FIG. 38 shows the third conductive layer of the pixel circuit. For example, as shown in FIG. 38, the third conductive layer of the pixel circuit includes the data line DAT and the first power line VDD. Combined with FIG. 34 and FIG. 38, the data line DAT is connected to the source area of the second thin-film transistor T2 in the semiconductor layer through at least one via hole (e.g., the via hole VH1) of the first gate insulation layer 113, the second gate insulation layer 114 and the interlayer dielectric layer 115. The first power line VDD is connected to the source area in the semiconductor layer corresponding to the fifth thin-film transistor T5 by at least one via hole (e.g., the via hole VH2) of the first gate insulation layer, a second gate insulation layer, and the interlayer dielectric layer. The first power line VDD is connected to the second capacitive electrode CE2 in the second conductive layer through at least one via hole (e.g., the via hole VH3) in the interlayer dielectric layer.

For example, the third conductive layer further includes a first connection portion CP1, a second connection portion CP2 and a third connection portion CP3. One end of the first connection portion CP1 is connected to the drain area in the semiconductor layer corresponding to the third thin film transistor T3 by at least one via hole (e.g., the via hole VH4) of the first gate insulation layer 113, the second gate insulation layer 114 and the interlayer dielectric layer 115, and the other end of the first connection portion CP1 is connected to the gate of the first thin-film transistor T1 in the first conductive layer through at least one via hole (e.g., the via hole VH5) of the second gate insulation layer 114 and the interlayer dielectric layer 115. One end of the second connecting portion CP2 is connected to the initialization line RL through a via hole (e.g., the via hole VH6) of the interlayer dielectric layer, and the other end of the second connecting portion CP2 is connected to the source area of the seventh thin-film transistor T7 and the source area of the fourth thin-film transistor T4 in the semiconductor layer through at least one via hole (e.g., the via hole VH7) of the first gate insulation layer 113, the second gate insulation layer 114 and the interlayer dielectric layer 115. The third connection portion CP3 is connected to the drain area of the sixth thin-film transistor T6 in the semiconductor layer by at least one via hole (e.g., the via hole VH8) of the first gate insulation layer 113, the second gate insulation layer 114 and the interlayer dielectric layer 115.

Figure 39:
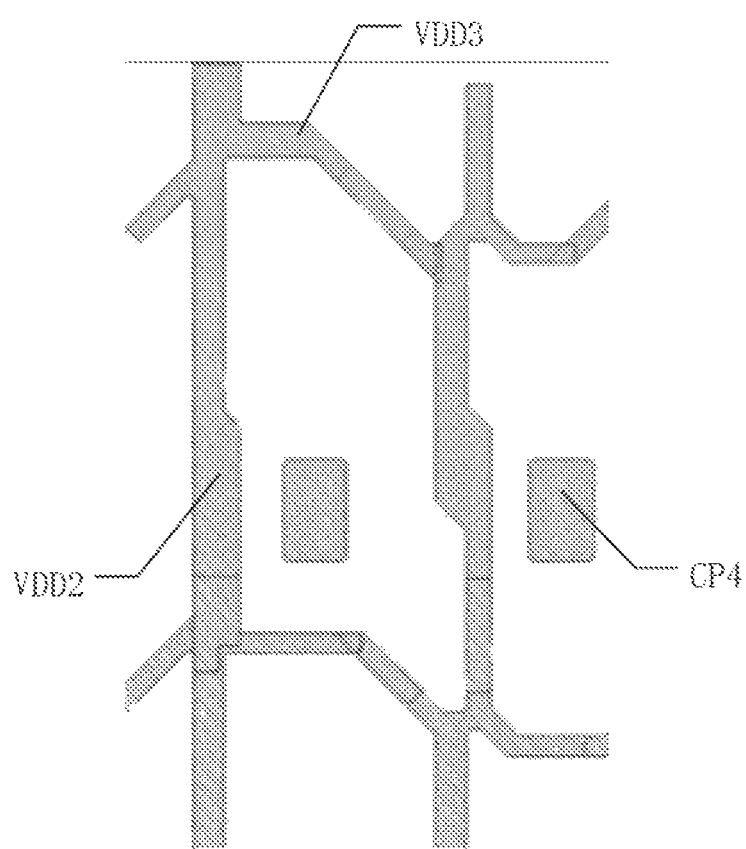
FIG. 39 illustrates a layout design of a conductive layer of a pixel circuit of an active area in a display panel according to an embodiment of the present disclosure.

For example, in some embodiments, the pixel circuit of the display panel may also have a fourth conductive layer. For example, FIG. 39 shows the fourth conductive layer of the pixel circuit. As shown in FIG. 39, the fourth conductive layer includes a second power line VDD2 and a third power cord VDD3, the second power cord VDD2 extends in a vertical direction shown in the drawing, and the third power cord VDD3 intersects the second power cord VDD2. For example, the second power line VDD2 and the third power line VDD3 are electrically connected to each other or integrated structure.

For example, in some embodiments, the second power line VDD2 and the third power line VDD3 are electrically connected to the first power line VDD through the via holes, respectively, thereby forming a reticular power line structure. This structure helps to reduce the resistance of the power line, thereby reducing the voltage drop of the power line, and helps to evenly deliver the supply voltage to the sub-pixels of the display panel.

For example, in some embodiments, the fourth conductive layer further includes a fourth connection portion CP4 insulated with the second power line VDD2 and the third power line VDD3, and the fourth connection portion is used to electrically connect the drain D6 of the sixth transistor T6 with the light-emitting sub-pixel. For example, the fourth connection portion is implemented as the first adapter electrode 227 in the above embodiment, for electrically connecting the first pixel electrode 321 of the light-emitting sub-pixel with the drain 221 of the thin-film transistor.

In the display panel provided by some embodiments of the present disclosure, a protective layer is formed on the fourth conductive layer described above, the protective layer includes the planarization portion shown in FIG. 15, FIG. 16 and FIG. 17, not shown in FIG. 34 to FIG. 38.

Figure 40:
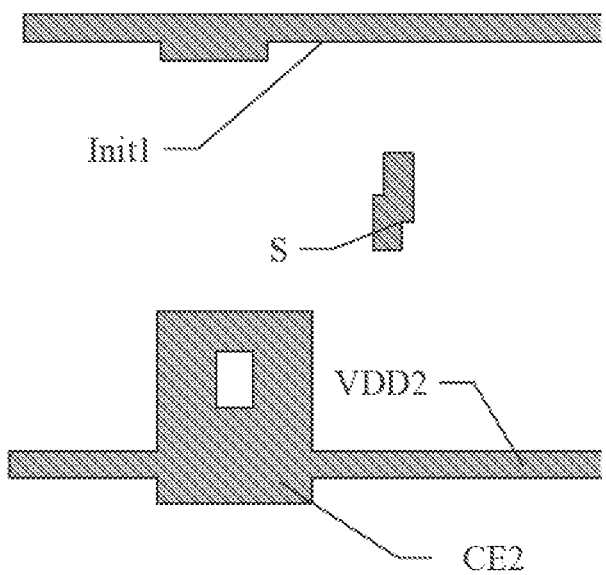
FIG. 40 illustrates another layout design of a second conductive layer of a pixel circuit of an active area in a display panel according to an embodiment of the present disclosure.

For example, in some embodiments, the above various conductive layers may also employ other layouts. For example, FIG. 40 shows another layout design of another second conductive layer. As shown in FIG. 40, in this example, the second conductive layer includes a second capacitor electrode CE2 (i.e., the second plate 226) of the storage capacitor Cst, a reset signal line Init1, the second power signal line VDD2, and a shading portion S. The second power signal line VDD2 is integrated with the second capacitive electrode CE2.

Figure 41:
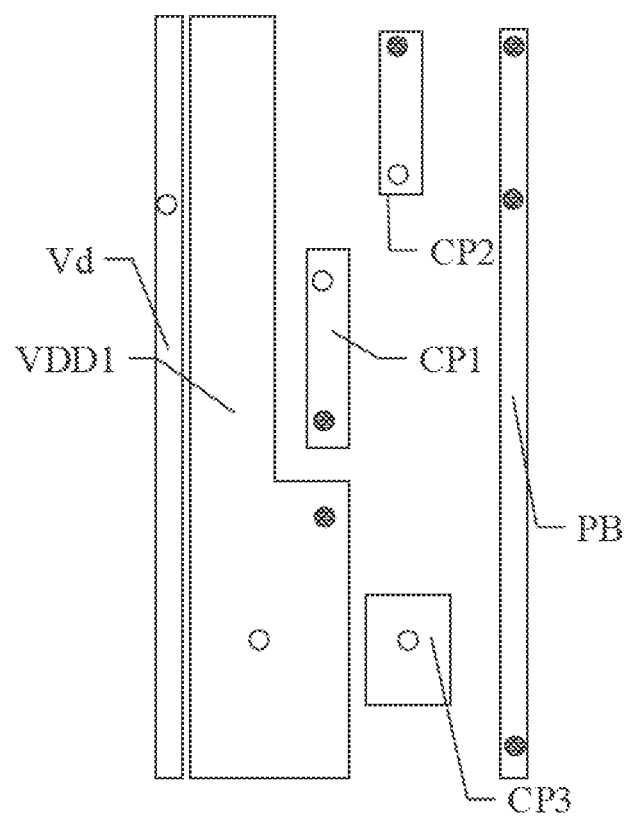
FIG. 41 illustrates another layout design of a third conductive layer of a pixel circuit of an active area in a display panel according to an embodiment of the present disclosure.

For example. FIG. 41 shows another layout design of another third conductive layer. As shown in FIG. 41, the third conductive layer includes the data line Vd, the first power signal line VDD1, and a shielded line PB. The above data line Vd, the first power signal line VDD1, and the shielded line PB all extend in the same direction, such as the vertical direction shown in the drawing. For example, the third conductive layer may also include the first connection portion CP1, the second connection portion CP2, and the third connection portion CP3 for electrically connecting different wirings or electrodes.

Figure 42:
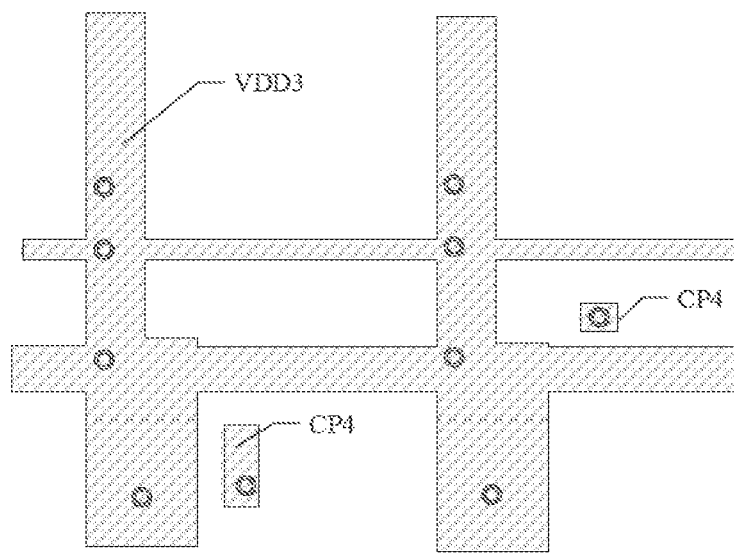
FIG. 42 illustrates another layout design of a fourth conductive layer of a pixel circuit of an active area in a display panel according to an embodiment of the present disclosure.

For example, FIG. 42 shows another layout design of another fourth conductive layer. As shown in FIG. 42, the fourth conductive layer includes the fourth connection portion CP4 and the third power signal lines VDD3 that are in cross-distribution along the vertical and horizontal direction shown in the drawing. For example, in some examples, the third power signal line VDD3 can be connected in parallel with the first power signal line VDD1 to form a reticular power structure, which is conducive to reducing the resistance of the power signal line.

The "one embodiment", "embodiment" or "one or more embodiments" mentioned herein means that the specific features, structures or features described in combination with the embodiments are included in at least one embodiment of the present disclosure. In addition, please note that the word "in one embodiment" does not necessarily refer to the same embodiment.

A large number of specific details are described in the specification provided here. However, it can be understood that the embodiments of the present disclosure can be practiced without these specific details. In some embodiments, the well-known methods, structures and techniques are not shown in detail so as not to obscure the understanding of the specification.

In the claims, any reference symbols located between the parentheses should not be constructed as a limitation on the claims. The word "comprise" does not exclude the existence of components or steps that are not listed in the claims. The word "a" or "one" before a component does not exclude the existence of multiple such components. The present disclosure may be implemented by means of hardware including a number of different elements and by means of a properly programmed computer. In the unit claims of the enumerated devices, several of these devices may be embodied by the same hardware item. The use of the words first, second, and third does not indicate any order. These words can be interpreted as names.

Finally, it should be noted that the above embodiments are only used to illustrate the technical solution of the application, not to limit it. Although the present disclosure has been described in detail with reference to the preceding embodiments, those skilled in the art should understand that they can still modify the technical solutions recorded in the preceding embodiments or replace some of the technical features equally. However, these modifications or substitutions do not make the essence of the corresponding technical solutions deviate from the spirit and scope of the technical solutions of the embodiments of the present disclosure.

The invention claimed is:

1. A display panel, comprising:
an opening area, wherein the opening area is provided with an opening;
an active area, wherein the active area at least partially surrounds the opening area; and
a first anti-crack area, wherein the first anti-crack area at least partially surrounds the opening area;
wherein the display panel in the first anti-crack area further comprises: a substrate, an encapsulation layer located on the substrate, and at least one circle of anti-crack protective layer located on the encapsulation layer;
the active area comprises at least one touch electrode layer; and
the anti-crack protective layer and at least one of the at least one touch electrode layer are arranged in a same layer and with a same material;
wherein the anti-crack protective layer comprises at least one layer of metal, and the touch electrode layer comprises a touch metal layer;
wherein the substrate and the encapsulation layer extend to the active area, and the touch metal layer is located on a side of the encapsulation layer away from the substrate;
wherein the at least one touch electrode layer comprises a first touch metal layer closer to the substrate, a second touch metal layer and a touch medium layer between the first touch metal layer and the second touch metal layer, and the anti-crack protective layer and the first touch metal layer are arranged in a same layer and with a same material; and/or
the anti-crack protective layer and the second touch metal layer are arranged in a same layer and with a same material.

2. The display panel according to claim 1, wherein the first touch metal layer is a bridging layer, the second touch metal layer is an electrode pattern layer, and the bridging layer is electrically connected to at least part of the electrode pattern layer through a through-hole penetrating the touch medium layer.

3. The display panel according to claim 1, wherein the anti-crack protective layer comprises a first anti-crack protective layer and a second anti-crack protective layer that are stacked, and the first anti-crack protective layer is provided between the second anti-crack protective layer and the substrate;
wherein the first anti-crack protective layer and the first touch metal layer are arranged in a same layer and with a same material; and
the second anti-crack protective layer and the second touch metal layer are arranged in a same layer and with a same material.

4. The display panel according to claim 1, wherein the anti-crack protective layer comprises a single-layer or tandem structure of metal or metal oxide.

5. The display panel according to claim 1, wherein the first anti-crack area further comprises at least one circle of first anti-crack dam located under the encapsulation layer; and the first anti-crack dam and the anti-crack protective layer are distributed on two sides of the encapsulation layer.

6. The display panel according to claim 5, wherein the first anti-crack dam and the anti-crack protective layer are stacked on two sides of the encapsulation layer, and an orthographic projection of the anti-crack protective layer on the substrate at least partially covers an orthographic projection of the first anti-crack dam on the substrate.

7. The display panel according to claim 1, wherein the first anti-crack dam and the anti-crack protective layer are dislocated on two sides of the encapsulation layer, and an orthographic projection of the anti-crack protective layer on the substrate is located between orthographic projections of two adjacent first anti-crack dams on the substrate.

8. The display panel according to claim 1, wherein the display panel further comprises: a stop zone surrounding the first anti-crack area; and the substrate and the encapsulation layer extend to the stop zone, and a stop dam is provided between the encapsulation layer and the substrate that are located in the stop zone.

9. The display panel according to claim 8, wherein the display panel further comprises: a second anti-crack area surrounding the stop zone; the display panel in the second anti-crack area further comprises: the substrate, and the encapsulation layer located on the substrate; wherein a second anti-crack dam is provided between the encapsulation layer and the substrate located in the second anti-crack area.

10. The display panel according to claim 9, wherein the first anti-crack area further comprises at least one circle of first anti-crack dam located under the encapsulation layer; the anti-crack protective layer and an orthographic projection of the first anti-crack dam and/or the second anti-crack dam have at least partially overlapped areas.

11. The display panel according to claim 1, wherein an area of the encapsulation layer contacted with at least one circle of a first anti-crack dam and/or at least one circle of a second anti-crack dam comprises at least one concave structure, and the anti-crack protective layer at least covers the concave structure.

12. A display panel, comprising:
an opening area, wherein the opening area is provided with an opening;
an active area, wherein the active area at least partially surrounds the opening area; and
a first anti-crack area, wherein the first anti-crack area at least partially surrounds the opening area;
wherein the display panel in the first anti-crack area further comprises: a substrate, an encapsulation layer located on the substrate, at least one circle of anti-crack protective layer located on the encapsulation layer and at least one circle of first anti-crack dam located under the encapsulation layer; an area of the encapsulation layer contacted with at least one circle of first anti-crack dam comprises at least one concave structure, the anti-crack protective layer at least covers the concave structure;
wherein the active area comprises at least one touch electrode layer, and the anti-crack protective layer and at least one of the at least one touch electrode layer are arranged in a same layer and with a same material;
wherein the anti-crack protective layer comprises at least one layer of metal, and the touch electrode layer comprises a touch metal layer;
wherein the substrate and the encapsulation layer extend to the active area, and the touch metal layer is located on a side of the encapsulation layer away from the substrate;
wherein the at least one touch electrode layer comprises a first touch metal layer closer to the substrate, a second touch metal layer and a touch medium layer between the first touch metal layer and the second touch metal layer, and the anti-crack protective layer and the first touch metal layer are arranged in a same layer and with a same material; and/or
the anti-crack protective layer and the second touch metal layer are arranged in a same layer and with a same material.

13. The display panel according to claim 12, wherein the first anti-crack dam and the anti-crack protective layer are stacked on two sides of the encapsulation layer, and an orthographic projection of the anti-crack protective layer on the substrate at least partially covers an orthographic projection of the first anti-crack dam on the substrate.

14. The display panel according to claim 12, wherein the first anti-crack dam and the anti-crack protective layer are dislocated on two sides of the encapsulation layer, and an orthographic projection of the anti-crack protective layer on the substrate is located between orthographic projections of two adjacent first anti-crack dams on the substrate.

15. The display panel according to claim 12, wherein the first anti-crack dam comprises at least one concave-convex structure, so that the encapsulation layer comprises a concave structure, and the concave structure comprises at least one step perpendicular to a direction of the substrate, and the anti-crack protective layer at least partially covers the step.

16. The display panel according to claim 15, wherein the concave structure comprises at least two first surfaces and a second surface located between the two first surfaces, and two steps connecting the first surfaces and the second surface are perpendicular to the direction of the substrate, and the anti-crack protective layer completely covers the concave structure.

17. The display panel according to claim 12, wherein the anti-crack protective layer comprises a first anti-crack protective layer and a second anti-crack protective layer that are stacked, the first anti-crack protective layer is provided between the second anti-crack protective layer and the substrate; and the first anti-crack protective layer at least partially covers the concave structure, and/or, the second anti-crack protective layer at least partially covers the concave structure.

* * * * *